US006966039B1

(12) United States Patent
Bartz et al.

(10) Patent No.: US 6,966,039 B1
(45) Date of Patent: Nov. 15, 2005

(54) METHOD FOR FACILITATING MICROCONTROLLER PROGRAMMING

(75) Inventors: Manfred Bartz, Snohomish, WA (US); Marat Zhaksilikov, Snohomish, WA (US); Steve Roe, Woodinville, WA (US); Kenneth Y. Ogami, Bothell, WA (US); Matthew A. Pleis, Carnation, WA (US); Douglas H. Anderson, Edmund, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/989,570

(22) Filed: Nov. 19, 2001

(51) Int. Cl.[7] .............................................. G06F 17/50
(52) U.S. Cl. ............................... 716/1; 716/16; 716/17; 345/764; 345/781
(58) Field of Search ........... 716/1, 2–21; 345/761–781; 709/310; 712/228; 717/168

(56) References Cited

U.S. PATENT DOCUMENTS

| | | | | |
|---|---|---|---|---|
| 4,656,603 A | * | 4/1987 | Dunn | 345/835 |
| 4,813,013 A | * | 3/1989 | Dunn | 345/763 |
| 4,831,546 A | * | 5/1989 | Mitsuta et al. | 703/1 |
| 5,225,991 A | * | 7/1993 | Dougherty | 716/9 |
| 5,544,067 A | * | 8/1996 | Rostoker et al. | 703/14 |
| 5,930,148 A | | 7/1999 | Bjorksten et al. | 364/488 |
| 6,014,135 A | * | 1/2000 | Fernandes | 345/744 |
| 6,052,524 A | | 4/2000 | Pauna | 395/500.43 |
| 6,121,965 A | * | 9/2000 | Kenney et al. | 345/810 |
| 6,449,761 B1 | * | 9/2002 | Greidinger et al. | 716/11 |
| 6,460,172 B1 | * | 10/2002 | Insenser Farre et al. | 716/17 |
| 6,571,373 B1 | | 5/2003 | Devins et al. | 716/5 |
| 6,578,174 B2 | * | 6/2003 | Zizzo | 716/1 |
| 6,615,167 B1 | | 9/2003 | Devins et al. | 703/28 |
| 6,715,132 B1 | * | 3/2004 | Bartz et al. | 716/1 |
| 6,817,005 B2 | * | 11/2004 | Mason et al. | 716/16 |
| 2002/0099863 A1 | * | 7/2002 | Comeau et al. | 709/310 |
| 2002/0144099 A1 | * | 10/2002 | Muro, Jr. et al. | 712/228 |
| 2002/0156929 A1 | * | 10/2002 | Hekmatpour | 709/310 |
| 2002/0170050 A1 | * | 11/2002 | Fiorella, III et al. | 717/168 |
| 2002/0183956 A1 | * | 12/2002 | Nightingale | 702/120 |
| 2002/0188910 A1 | * | 12/2002 | Zizzo | 716/1 |
| 2003/0038842 A1 | * | 2/2003 | Peck et al. | 345/763 |

\* cited by examiner

*Primary Examiner*—Vuthe Siek
*Assistant Examiner*—Magid Y. Dimyan
(74) *Attorney, Agent, or Firm*—Wagner, Murabito & Hao LLP

(57) ABSTRACT

A method to facilitate circuit design. First, a schematic and data sheet for a selected module may be displayed. Next, in response to a request for a position for the module among available resources (e.g., programmable system blocks), a potential position for the module is computed. The position is displayed on a graphical user interface by mapping the module to one or more programmable system blocks. Additional user modules may then be selected and placed. After allowing the user to configure the circuit by selecting circuit parameters and pin-outs, various items are automatically generated to facilitate programming the target device. For example, application programming interfaces (APIs) for programming an operation of the modules, source code for realizing the modules in the resources, an interrupt vector table, and a data sheet for the circuit may be automatically generated.

27 Claims, 34 Drawing Sheets

FIGURE 1D

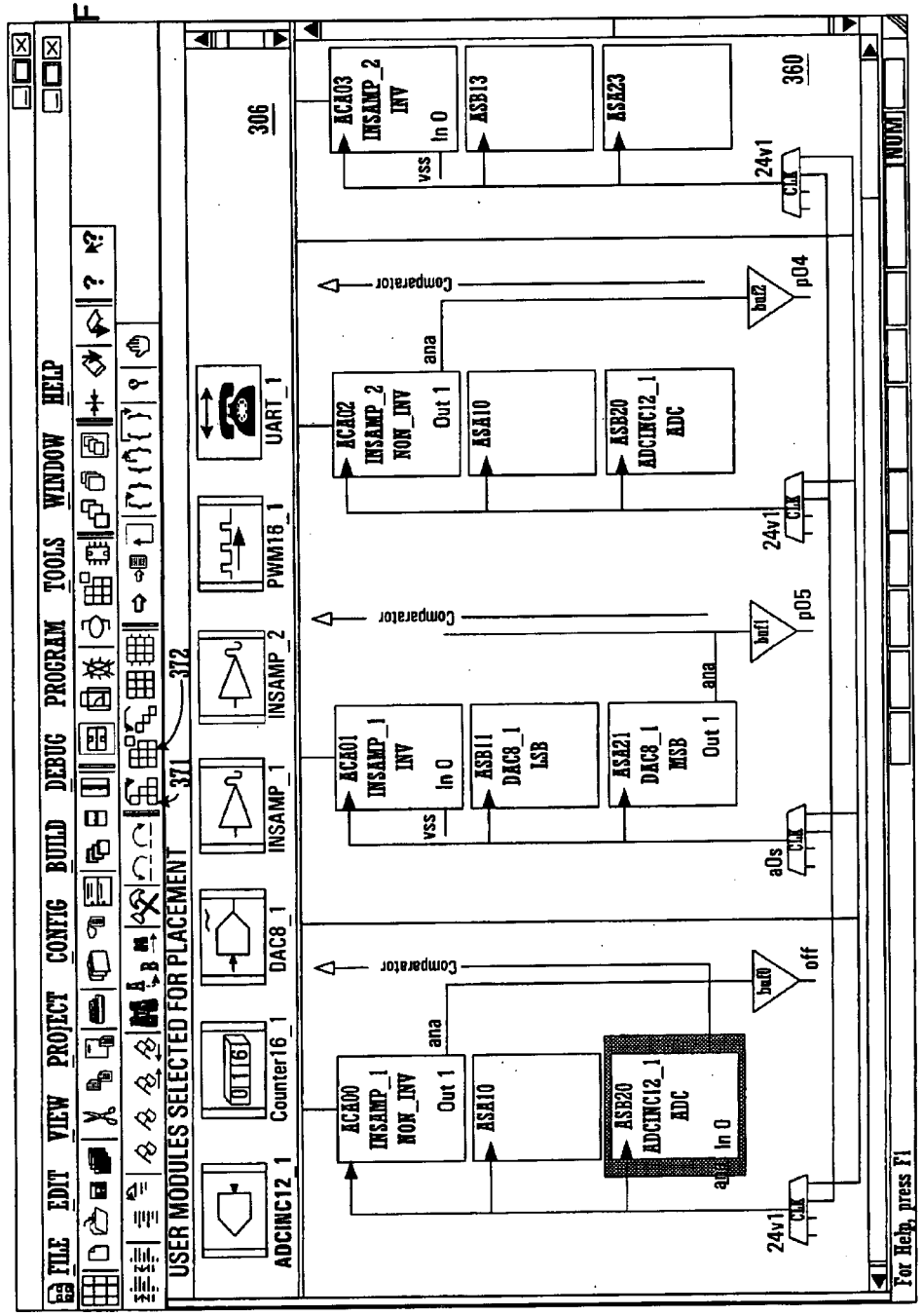

```
configtbl.asm
;  Personalization tables
export LoadConfigTBL_project_Bank1
export LoadConfigTBL_project_Bank0
LoadConfigTBL_project_Bank1:
;  Global Register values
        db      61h, 03h        ;AnalogClockSelect register
        db      60h, 08h        ;AnalogColumnClockSelect register
        db      62h, 30h        ;AnalogOControl register
        db      63h, 00h        ;AnalogModulatorControl register
        db      e1h, 30h        ;OscillatorControl_1 register
        db      00h, 00h        ;Port_0_DriveMode_0 register
        db      01h, 3fh        ;Port_0_DriveMode_1 register
        db      04h, a1h        ;Port_1_DriveMode_0 register
        db      05h, 50h        ;Port_1_DriveMode_1 register
        db      08h, 00h        ;Port_2_DriveMode_0 register
        db      09h, 00h        ;Port_2_DriveMode_1 register
        db      0ch, 00h        ;Port_3_DriveMode_0 register
        db      0dh, 00h        ;Port_3_DriveMode_1 register
        db      10h, 00h        ;Port_4_DriveMode_0 register
        db      11h, 00h        ;Port_4_DriveMode_1 register
        db      14h, 00h        ;Port_5_DriveMode_0 register
        db      15h, 00h        ;Port_5_DriveMode_1 register
        db      e3h, 84h        ;VoltageMonitorControl register
;  Instance name ADCINC12_1, User Module ADCINC12
;    Instance name ADCINC12_1, Block Name ADC(ASB20)
        db      90h, 90h        ;ADCINC12_1_AtoDcr0
        db      91h, 60h        ;ADCINC12_1_AtoDcr1
        db      92h, 60h        ;ADCINC12_1_AtoDcr2
        db      93h, f0h        ;ADCINC12_1_AtoDcr3
;    Instance Name ADCINC12_1, Block Name CNT(DBA01)
        db      24h, 21h        ;ADCINC12_1_CounterFN
        db      25h, 48h        ;ADCINC12_1_CounterSL
        db      26h, 00h        ;ADCINC12_1_CounterOS
;    Instance Name ADCINC12_1, Block Name TMR(DBA00)
        db      20h, 20h        ;ADCINC12_1_TimerFN
        db      21h, 18h        ;ADCINC12_1_TimerSL
        db      22h, 00h        ;ADCINC12_1_TimerOS
;  Instance name Counter16_1, User Module Counter 16
;    Instance name Counter16_1, Block Name CNTR16_LSB(DBA02)
        db      28h, 01h        ;Counter16_1_FUNC_LSB_REG
        db      29h, 16h        ;Counter16_1_INPUT_LSB_REG
        db      2ah, 00h        ;Counter16_1_OUTPUT_LSB_REG
;    Instance name Counter16_1, Block Name CNTR16_MSB(DBA03)
        db      2ch, 21h        ;Counter16_1_FUNC_MSB_REG
        db      2dh, 36h        ;Counter16_1_INPUT_MSB_REG
        db      2eh, 04h        ;Counter16_1_OUTPUT_MSB_REG
```

FIGURE 7A

```
; Instance name DAC8_1, User Module DAC8
;     Instance name DAC8_1, Block Name LSB(ASB11)
        db              84h, 80h        ;DAC8_1_LSB_CR0
        db              85h, 80h        ;DAC8_1_LSB_CR1
        db              86h, 20h        ;DAC8_1_LSB_CR2
        db              87h, 30h        ;DAC8_1_LSB_CR3
;     Instance name DAC8_1, Block Name MSB(ASA21)
        db              94h, a0h        ;DAC8_1_MSB_CR0
```

FIGURE 7A (Continued)

```
            db        95h, 41h       ;DAC8_1_MSB_CR1
            db        96h, a0h       ;DAC8_1_MSB_CR2
            db        97h, 30h       ;DAC8_1_MSB_CR3
; Instance name INSAMP_1, User Module INSAMP
;   Instance name INSAMP_1, Block Name INV(ACA01)
            db        75h, beh       ;INSAMP_1_INV_CR0
            db        76h, 21h       ;INSAMP_1_INV_CR1
            db        77h, 20h       ;INSAMP_1_INV_CR2
;   Instance name INSAMP_2, Block Name NON-INV(ACA00)
            db        71h, 3ch       ;INSAMP_1_NON_INV_CR0
            db        72h, a1h       ;INSAMP_1_NON_INV_CR1
            db        73h, 20h       ;INSAMP_1_NON_INV_CR2
; Instance name INSAMP_2, User Module INSAMP
;   Instance name INSAMP_2, Block Name INV(ACA03)
            db        7dh, ceh       ;INSAMP_2_INV_CR0
            db        7eh, 21h       ;INSAMP_2_INV_CR1
            db        7fh, 20h       ;INSAMP_2_INV_CR2
;   Instance name INSAMP_2, Block Name NON_INV(ACA02)
            db        79h, 2ch       ;INSAMP_2_NON_INV_CR0
            db        7ah, a1h       ;INSAMP_2_NON_INV_CR1
            db        7bh, 20h       ;INSAMP_2_NON_INV_CR2
; Instance name PWM16_1, User Module PWM16
;   Instance name PWM16_1, Block Name PWM16_LSB(DCA04)
            db        30h, 01h       ;PWM16_1_FUNC_LSB_REG
            db        31h, c4h       ;PWM16_1_INPUT_LSB_REG
            db        32h, 00h       ;PWM16_1_OUTPUT_LSB_REG
;   Instance name PWM16_1, Block Name PWM16_MSB(DCA05)
            db        34h, 21h       ;PWM16_1_FUNC_MSB_REG
            db        35h, 34h       ;PWM16_1_INPUT_MSB_REG
            db        36h, 05h       ;PWM16_1_OUTPUT_MSB_REG
; Instance name UART_1, User Module UART
;   Instance name UART_1, Block Name RX(DCA07)
            db        3ch, 05h       ;UART_1_RX_FUNC_REG
            db        3dh, e1h       ;UART_1_RX_INPUT_REG
            db        3eh, 00h       ;UART_1_RX_OUTPUT_REG
;   Instance name UART_1, Block Name TX(DCA06)
            db        38h, 0dh       ;UART_1_TX_FUNC_REG
            db        39h, 01h       ;UART_1_TX_INPUT_REG
            db        3ah, 07h       ;UART_1_TX_OUTPUT_REG
            db        ffh
```

FIGURE 7B

```
LoadConfigTBL_project_Bank0:
; Global Register values
        db          60h, 14h        ;AnalogColumnInputSelect register
        db          63h, 05h        ;AnalogReferenceControl register
        db          65h, 00h        ;AnalogSyncControl register
        db          e6h, 00h        ;DecimatorControl register
        db          02h, 00h        ;Port_0_Bypass register
        db          06h, f1h        ;Port_1_Bypass register
        db          0ah, 00h        ;Port_2_Bypass register
        db          0eh, 00h        ;Port_3_Bypass register
        db          12h, 00h        ;Port_4_Bypass register
        db          16h, 00h        ;Port_5_Bypass register
; Instance name ADCINC12_1, User Module ADCINC12
;   Instance name ADCINC12_1, Block Name ADC(ASB20)
;   Instance name ADCINC12_1, Block Name CNT(DBA01)
```

FIGURE 7B (Continued)

```
        db      27h, 00h        ;ADCINC12_1_CounterCR0
        db      25h, 00h        ;ADCINC12_1_CounterDR1
        db      26h, 00h        ;ADCINC12_1_CounterDR2
;   Instance name ADCINC12_1, Block Name TMR(DBA00)
        db      23h, 00h        ;ADCINC12_1_TimerCR0
        db      21h, 00h        ;ADCINC12_1_TimerDR1
        db      22h, 00h        ;ADCINC12_1_TimerDR2
; Instance name Counter16_1, User Module Counter16
;   Instance name Counter16, Block Name CNTR16_LSB(DBA02)
        db      2bh, 00h        ;Counter16_1_CONTROL_LSB_REG
        db      29h, 80h        ;Counter16_1_PERIOD_LSB_REG
        db      2ah, 64h        ;Counter16_1_COMPARE_LSB_REG
;   Instance name Counter16_1, Block Name CNTR16_MSB(DBA03)
        db      2fh, 00h        ;Counter16_1_CONTROL_MSB_REG
        db      2dh, 00h        ;Counter16_1_PERIOD_MSB_REG
        db      2eh, 00h        ;Counter16_1_COMPARE_MSB_REG
; Instance name DAC8_1, User Module DAC8
;   Instance name DAC8_1, Block Name LSB(ASB11)
;   Instance name DAC8_1, Block Name MSB(ASA21)
; Instance name INSAMP_1, User Module INSAMP
;   Instance name INSAMP_1, Block Name INV(ACA01)
;   Instance name INSAMP_1, Block Name NON_INV(ACA00)
; Instance name INSAMP_2, User Module INSAMP
;   Instance name INSAMP_2, Block Name INV(ACA03)
;   Instance name INSAMP_2, Block Name NON_INV(ACA02)
; Instance name PWM16_1, User Module PWM16
;   Instance name PWM16_1, Block Name PWM16_LSB(DCA04)
        db      33h, 00h        ;PWM16_1_CONTROL_LSB_REG
        db      31h, 37h        ;PWM16_1_PERIOD_LSB_REG
        db      32h, 64h        ;PWM16_1_PWIDTH_LSB_REG
;   Instance name PWM16_1, Block Name PWM16_MSB(DCA05)
        db      37h, 00h        ;PWM16_1_CONTROL_MSB_REG
        db      35h, 00h        ;PWM16_1_PERIOD_MSB_REG
        db      36h, 00h        ;PWM16_1_PWIDTH_MSB_REG
; Instance name UART_1, User Module UART
;   Instance name UART_1, Block Name RX(DCA07)
        db      3fh, 00h        ;UART_1_RX_CONTROL_REG
        db      3dh, 00h        ;UART_1_
        db      3eh, 00h        ;UART_1_RX_BUFFER_REG
;   Instance name UART_1, Block Name TX(DCA06)
        db      3bh, 00h        ;UART_1_TX_CONTROL_REG
        db      39h, 00h        ;UART_1_TX_BUFFER_REG
        db      3ah, 00h        ;UART_1_
        db      ffh ;Configuration file trailer Config.asm
```

FIGURE 7C

```
; Config.asm
;
; This file is generated by the Device Editor on Application Generation.
; It contains code which loads the configuration data table generated in
; the file ConfigTBL.asm
;

export LoadConfigInit
export_LoadConfigInit
Export LoadConfig_project
export_LoadConfig_project Flag_CFG_MASK:      equ     10h             ;M8C flag register REG address bit
mask
END_CONFIG_TABLE:   equ     ffh             ;end of config table indicator _LoadConfigInit:
LoadConfigInit:
            lcall   LoadConfig_project ret ;
;Load Configuration project
;
_LoadConfig_project:
LoadConfig_project:
            or          F, FLAG_CFG_MASK                                    ;set for
bank 1
            mov         A, >LoadConfigTBL_project_Bank1   ;load bank 1 table
            mov         X, <LoadConfigTBL_project_Bank1
            call  LoadConfig                                                ;load the
bank 1 values
            and         F, ~FLAG_CFG_MASK                                   ;switch
to bank 0
            mov         A, >LoadConfigTBL_project_Bank0 ;load bank 0 table
            mov         X, <LoadConfigTBL_project_Bank0
            call  LoadConfig                                                ;load the
bank 0 values
            ret ;
; LoadConfig
;
; This function is not exported. It assumes that the addresses of the table to be loaded
; is contained in the X and A registers as if a romx instruction is the next instruction
```

FIGURE 8A

; to be executed, i.e. lower address in X and upper address in A. There is no return value.
;
LoadConfig:
LoadConfigLp:
```
        push    X                               ;save config table address on stack
        push    A
        romx                                    ;load config address
        cmp     A, END_CONFIG_TABLE  ;check for end of table
        jz      EndLoadConfig               ;if so, end of load
        mov     X, SP                           ;save the address away
        mov     [X], A
        pop     A                               ;retieve the table address
        pop     X
        inc     X                               ;advance to the data byte
        jnc     NoOverFlow1             ;check for overflow
        inc     A                               ;if so, increment MSB
NoOverFlow1:
        PUSH    x                               ;save the config table address
again
        push    A
        romx                                    ;load the config data
        mov     X, SP                           ;retrieve the config address
        mov     X, [X]
        mov     reg[X], A           ;write the config data
        pop     A                               ;retieve the table address
        pop     X
        inc     X                               ;advance to the next
address
        jnc     NoOverFlow2             ;check for overflow
        inc     A                               ;if so, increment MSB
NoOverFlow2:
        jmp     LoadConfigLp            ;loop back
EndLoadConfig:
        pop     A                               ;clean up the stack
        pop     A
        ret
```

FIGURE 8B

```
;;***********************************************
;;
;;***********************************************
;;
;; ADCINC12.asm
;;
;; Assembler source for the 12 bit Incremental
;;A/D converter.
;;
;;***********************************************
;;
;;***********************************************
;;

export ADCINC12_1_Start
    export_ADCINC12_1_Start
    export ADCINC12_1_SetPower
    export_ADCINC12_1_SetPower
    export ADCINC12_1_Stop
    export_ADCINC12_1_Stop
    export ADCINC12_1_GetSamples
    export_ADCINC12_1_GetSamples
    export ADCINC12_1_StopAD
    export_ADCINC12_1_StopAD
    export ADCINC12_1_fIsdata
    export_ADCINC12_1_fIsdata
    export ADCINC12_1_GetData
    export_ADCINC12_1_GetData
    export ADCINC12_1_ClearFlag
    export_ADCINC12_1_ClearFlag include "ADCINC12_1.inc"
    include "m8c.inc"

LowByte:    equ 1
HighByte:   equ 0

;;----------------------------------------------
;;
;; Start:
;; SetPower:
;; Applies power setting to the module's analog
;; Programmable System block
;; INPUTS: A contains the power setting
;; OUTPUTS: None.
;;----------------------------------------------
ADCINC12_1_Start:
_ADCINC12_1_Start:
ADCINC12_1_SetPower:
_ADCINC12_1_SetPower:
    and A,03h
    or A,f0h
    mov reg[ADCINC12_1_AtoDcr3],A
    ret ;;----------------------------------------------
;; Stop:
;; SetPower:
;; Removes power setting to the module's analog
;; Programmable System block
;; INPUTS: None
;; OUTPUTS: None.
;;----------------------------------------------
ADCINC12_1_Stop:
_ADCINC12_1_Stop:
    and reg[ADCINC12_1_AtoDcr3],~03h
    ret ;;----------------------------------------------
;; Get_Samples:
;; SetPower:
;; Starts the A/D convertor and will place data in
;;memory. A flag
;; is set whenever a new data value is available.
;; INPUTS: A passses the number of samples (0
;;is continuous).
;; OUTPUTS: None.
;;----------------------------------------------
ADCINC12_1_GetSamples:
_ADCINC12_1_GetSamples:
    mov [ADCINC12_1_blncrC],A    ;number
;of samples
    or reg[INT_MSK1],(ADCINC12_1_TimerMask |
ADCINC12_1_CounterMask)
                                 ;enable both interrupts
    Mov[ADCINC12_1_cTimerU],0    ;Force the
;Timer to do one cycle of rest
    or reg{ADCINC12_1_AtoDcr3],10h  ;force the
;Integrator into reset
    mov[ADCINC12_1_cCounterU],ffh  ;Initialize
;Counter mov[ADCINC12_1_TimerDR1],ffh
    mov[ADCINC12_1_CounterDR1],ffh
    mov[ADCINC12_1_TimerCR0],01h   ;enable
;the Timer
    mov[ADCINC12_1_fIncr],00h      ;A/D Data
;Ready Flag is reset
    ret
```

FIGURE 9A

```
;;-----------------------------------------
;; StopAD:
;; Completely shuts down the A/D in an orderly
;;manner. Both the
;; Timer and Counter Interrupts are disabled.
;; INPUTS: None.
;; OUTPUTS: None.
;;-----------------------------------------
ADCINC12_1_StopAD:
_ADCINC12_1_StopAD:
   mov[ADCINC12_1_TimerCR0],00h
;disable the Timer
   mov[ADCINC12_1_CounterCR0],00h
;disable the Counter
   nop
   nop
   and
reg[INT_MSK1],~(ADCINC12_1_TimerMask |
ADCINC12_1_CounterMask)
                              ;Disable both
;;interrupts
   or reg[ADCINC12_1_AtoDc3],10h      ;reset
;;Intergrator
   ret
;;-----------------------------------------
;; fIsdata:
;; Returns the status of the A/D Data
;; is set whenever a new data value is available.
;; INPUTS: None.
;; OUTPUTS: A returned data status A=:0 no
;;data available
;;              !=: 0 data available.
;;-----------------------------------------
ADCINC12_1_fIsdata:
_ADCINC12_1_fIsdata:
   movA,[ADCINC12_1_fIncr]
   ret
;;-----------------------------------------
;; iGetData:
;; Returns the status from the A/D. Does not
;;check if data is
;; available.
;; is set whenever a new data value is available.
;; INPUTS: None.
;; OUTPUTS: X:A returns the A/D data value.

;;-----------------------------------------
```

(Continued)

```
ADCINC12_1_iGetData:
_ADCINC12_1_iGetData:
   mov X,[(ADCINC12_1_iIncr+HighByte)]
   mov A,[(ADCINC12_1_iIncr+LowByte)]
   ret ;;-----------------------------------------
;; ClearFlag:
;; clears the data ready flag.
;; INPUTS: None
;; OUTPUTS: None.
;;-----------------------------------------
ADCINC12_1_ClearFlag:
_ADCINC12_1_ClearFlag:
   mov [ADCINC12_1_fIncr],00h
   ret ADCINC12_1_API_End:
```

FIGURE 9B

```
HEADER FILES//  *******************************************
//  *******************************************
//
// ADCINC12_1.h for the 12 bit incremental A/D converter
//
// C declarations for the ADCINC12 User Module
//
//
//  *******************************************
//******************************************* define ADCINC12_1_OFF        0
define ADCINC12_1_LOWPOWER   1
#define ADCINC12_1_MEDPOWER   2
define ADCINC12_1_HIGHPOWER  3 pragma fastcall ADCINC12_1_Start
pragma fastcall ADCINC12_1_SetPower
#pragma fastcall ADCINC12_1_GetSamples
#pragma fastcall ADCINC12_1_StopAD
pragma fastcall ADCINC12_1_Stop pragma fastcall ADCINC12_1_fIsData
pragma fastcall ADCINC12_1_iGetData
pragma fastcall ADCINC12_1_ClearFlag extern void ADCINC12_1_Start(char power);
extern void ADCINC12_1_SetPower(char power);
extern void ADCINC12_1_GetSamples(char chout);
extern void ADCINC12_1_StopAD(void);
extern void ADCINC12_1_Stop(void);

extern char ADCINC12_1_fIsData(void);
extern int  ADCINC12_1_iGetData(void);
extern void ADCINC12_1_ClearFlag(void);
```

FIGURE 10

```
;; ***********************************************
;;
;;
;; ADCINC12_1.inc for the 12 bit incremental A/D converter
;;
;; Assembler declarations for the ADCINC12 User Module
;;
;;;;
;; ***********************************************
;;
;; ***********************************************
;;
```

| ADCINC12_1_AtoDcr0:   | equ | 90h |
|---|---|---|
| ADCINC12_1_AtoDcr1:   | equ | 91h |
| ADCINC12_1_AtoDcr2:   | equ | 92h |
| ADCINC12_1_AtoDcr3:   | equ | 93h |
| ADCINC12_1_CounterFN: | equ | 24h |
| ADCINC12_1_CounterSL: | equ | 25h |
| ADCINC12_1_CounterOS: | equ | 26h |
| ADCINC12_1_CounterDR0:| equ | 24h |
| ADCINC12_1_CounterDR1:| equ | 25h |
| ADCINC12_1_CounterDR2:| equ | 26h |
| ADCINC12_1_CounterCR0:| equ | 27h |
| ADCINC12_1_TimerFN:   | equ | 20h |
| ADCINC12_1_TimerSL:   | equ | 21h |
| ADCINC12_1_TimerOS:   | equ | 22h |
| ADCINC12_1_TimerDR0:  | equ | 20h |
| ADCINC12_1_TimerDR1:  | equ | 21h |
| ADCINC12_1_TimerDR2:  | equ | 22h |
| ADCINC12_1_TimerCR0:  | equ | 23h |
| ADCINC12_1_TimerMask: | equ | 01h |
| ADCINC12_1_CounterMask:| equ | 02h |
| ADCINC12_1_OFF:       | equ | 0 |
| ADCINC12_1_LOWPOWER:  | equ | 1 |
| ADCINC12_1_MEDPOWER:  | equ | 2 |
| ADCINC12_1_HIGHPOWER: | equ | 3 |
| ADCINC12_1_NUMBITS:   | equ | 12 |

FIGURE 11

```
;;***********************************************
;;
;; ADCINC12int.asm
;;
;;
;; Assembler source for interrupt routines the 12 bit Incremental
;;A/D converter.
;;
;;
;;***********************************************
;;

export ADCINC12_1_CNT_INT
export ADCINC12_1_TMR_INT
include "ADCINC12_1.inc"
include "m8c.inc"

Area bss(RAM)
    ADCINC12_1_cTimerU:   BLK 1    ;The upper byte of the Timer
    ADCINC12_1_cCounterU: BLK 1    ;The Upper byte of the Counter
    ADCINC12_1_iIncr:
    ADCINC12_1_iIncr:     BLK 2    ;A/D value
    ADCINC12_1_fIncr
    ADCINC12_1_fIncr:     BLK 1    ;Data Valid Flag
    ADCINC12_1_bIncrC:    BLK 1    ;# of times to run A/D area text(ROM,REL)

export_ADCINC12_1_cTimerU
export ADCINC12_1_cCounterU
export_ADCINC12_1_iIncr
export ADCINC12_1_iIncr
export_ADCINC12_1_fIncr
export ADCINC12_1_fIncr
export_ADCINC12_1_bIncrC LowByte:   equ 1
HighByte:  equ 0

;;----------------------------------------------------------
;;
;; CNT_INT:
;; Decrement the upper (software) half on the counter whenever the
;; lower (hardware) half of the counter underflows.
;; INPUTS:: None.
;; OUTPUTS: None.
;;
;;----------------------------------------------------------
ADCINC12_1_CNT_INT:
    dec [ADCINC12_1_cCounterU]
    reti
```

FIGURE 12A

```
;; ----------------------------------------------------------------
;;
;; TMR_INT:
;; This routine allows the counter to collect data for 64 timer cycles
;; This routine then holds the integrator in reset for one cycle while
;; the A/D value is calculated.
;; INPUTS:: None.
;; OUTPUTS: None.
;;
;; ----------------------------------------------------------------
ADCINC12_1_TMR_INT:
  dec[ADCINC12_1_cTimerU]
; if(upper count>=0)
  jc else 1
    reti
  else 1:;(upper count decremented pass 0)
    tst reg[ADCINC_1_AtoDcr3],10h   ;to change when ice is fixed dbz
    jz else2
```

```
; if(A/D has been in reset mode)
    mov reg[ADCINC12_1_CounterCR0],01h      ;Enable Counter
    and reg[ADCINC12_1_AtoDcr3],~10h        ;Enable Analog Counter
    mov reg[ADCINC12_1_cTimerU],((1<<(ADCINC12_1_NUMBITS-6))-1)
                                            ;This will be the real counter value
    reti
    else2:;(A/D has been in integrate mode)
    mov reg[ADCINC12_1_CounterCR0],00h      ;disable Counter
    or F,01h                                ;Enable the interrupts
;;;;;;;;;;;;;;;;;;;;;;;;;;;;;;;;;;;;;;;;;;;;;;;;;;;;;;;;;;;;;;;;;;;;;;;;;;;;;;;;
; Good place to add code to switch inputs for multiplexed input to ADC
;;;;;;;;;;;;;;;;;;;;;;;;;;;;;;;;;;;;;;;;;;;;;;;;;;;;;;;;;;;;;;;;;;;;;;;;;;;;;;;;
    or reg[ADCINC12_1_AtoDcr3],10h ;Reset Integrator
    mov [(ADCINC12_1_ilncr+LowByte)],ffh
    mov [(ADCINC12_1_ilncr+HighByte)],(ffh-(ADCINC12_1_NUMBITS-7))
;
    push A
    mov A, reg[ADCINC12_1_CounterDR0],01h   ;read Counter
    mov A, reg[ADCINC12_1_CounterDR2],01h   ;now you really read the data
    sub[(ADCINC12_1_ilncr+LowByte)],A
    mov A, reg[ADCINC12_1_cCounterU]
    sbb[(ADCINC12_1_ilncr+HighByte)],A
    pop A
    cmp[(ADCINC12_1_ilncr+HighByte)],(1<<(ADCINC12_1_NUMBITS-7))
    jnz endif10
; if(max positive value)
        dec[(ADCINC12_1_ilncr+HighByte)]
        mov[(ADCINC12_1_ilncr+LowByte)],ffh
    endif10:
    asr[(ADCINC12_1_ilncr+HighByte)]        ;divide by 4
    rrc[(ADCINC12_1_ilncr+LowByte)]
    asr[(ADCINC12_1_ilncr+HighByte)]
    rrc[(ADCINC12_1_ilncr+LowByte)]

mov[ADCINC12_1_fIncr],01h               ;set AD data flag
```

FIGURE 12B

```
;;;;;;;;;;;;;;;;;;;;;;;;;;;;;;;;;;;;;;;;;;;;;;;;;;;;;;;;;;;;;;;;;;;;;;;;;;;;;;
; User code here for interrupt system.
;;;;;;;;;;;;;;;;;;;;;;;;;;;;;;;;;;;;;;;;;;;;;;;;;;;;;;;;;;;;;;;;;;;;;;;;;;;;;;
    cmp[ADCINC12_1_blncrC],00h
    jz endif3
; if(ADCINC12_1_blncrC is not zero)
    dec[ADCINC12_1_blncrC]
    jnz endif4
; if(ADCINC12_1_blncrC has decremented down to zero to 0))
    mov reg[ADCINC12_1_TimerCR0],00h        ;disable the Timer
    mov reg[ADCINC12_1_CounterCR0],00h-     ;disable the Counter
    nop
    nop
    and reg[INT_MSK1],~(ADCINC12_1_TimerMask | ADCINC12_1_CounterMask)
                                            ;disable both interrupts
    or reg[ADCINC12_1_AtoDcr3],10h          ;reset Integrator
    reti
   endif4:;
   endif3:;
  endif2:;
  mov [ADCINC12_1_cTimerU],00h              ;Set Timer for one cycle of reset
  mov [ADCINC12_1_cCounterU],ffh            ;Set Counter hardware for easy enable
  mov reg[ADCINC12_1_CounterDR1],ffh
  reti
 endif1:;

ADCINC12_1_APIINT_End: A/D converter
```

```
;--------------------------------------------------
; Interrupt Vector Table
;--------------------------------------------------
;
; Interrupt vector table entries are 4 bytes long
; and contain the code
; that services the interrupt (or causes it to be
; serviced).
;
;--------------------------------------------------

Area    TOP(ROM,ABS)

org 0                  ;Reset Interrupt Vector
   jmp_start              ;First Instruction
; executed following a Reset org 04h                ;Supply Monitor Interrupt
; Vector
   //call void_handler
   reti org08h        ;Block DBA00
; Interrupt Vector
   ljmp  ADCINC12_1_TMR_INT
   reti org0Ch        ;Block DBA01
; Interrupt Vector
   ljmp  ADCINC12_1_CNT_INT
   reti org10h        ;Block DBA02
; Interrupt Vector
   //call void_handler
   reti org14h        ;Block DBA03
; Interrupt Vector
   ljmp  Counter16_1INT
   reti org 18h       ;Block DCA04
; Interrupt Vector
   //call void_handler
   reti org 1Ch               ;Block DCA0
; Interrupt Vector
   ljmp  PWM16_1INT
   reti org 20h               ;Block DCA06
; Interrupt Vector
   ljmp  UART_1TX_INT
   reti org 24h               ;Block DCA07
; Interrupt Vector
   ljmp  UART_1RX_INT
   reti org 28h               ;Analog Column 0
; Interrupt Vector
   //call void_handler
   reti org 2Ch               ;Analog Column 1
; Interrupt Vector
   //call void_handler
   reti org 30h               ;Analog Column 2
; Interrupt Vector
   //call void_handler
   reti org 34h               ;Analog Column 3
; Interrupt Vector
   //call void_handler
   reti org 38h               ;GPIO Interrupt Vector
   //call void_handler
   reti org 3Ch               ;Sleep Timer Interrupt
; Vector
   jmp  SleepTimerISR
   reti
```

FIGURE 13A

| boot.asm Interrupt Name | Data Sheet Interrupt Name | Type |
|---|---|---|
| Start | Reset | Fixed |
| Interrupt1 | Supply Monitor | Fixed |
| Interrupt2 | DBA00 | Programmable System Block |
| Interrupt3 | DBA01 | Programmable System Block |
| Interrupt4 | DBA02 | Programmable System Block |
| Interrupt5 | DBA03 | Programmable System Block |
| Interrupt6 | DCA04 | Programmable System Block |
| Interrupt7 | DCA05 | Programmable System Block |
| Interrupt8 | DCA06 | Programmable System Block |
| Interrupt9 | DCA07 | Programmable System Block |
| Interrupt10 | Analog Column 0 | Programmable System Block |
| Interrupt11 | Analog Column 1 | Programmable System Block |
| Interrupt12 | Analog Column 2 | Programmable System Block |
| Interrupt13 | Analog Column 3 | Programmable System Block |
| Interrupt14 | GPIO | Fixed |
| Interrupt15 | SLEEP TIMER | Fixed |

Columns labeled 1351, 1352, 1353.

FIGURE 13B

METHOD FOR FACILITATING MICROCONTROLLER PROGRAMMING

RELATED APPLICATIONS

This application is related to co-pending, commonly-owned U.S. Patent Application Ser. No. 09/989,571, filed Nov. 19, 2001, entitled "Method for Faciltating Microcontroller Programming," by Bartz et al; and to co-pending, commonly-owned U.S. Patent Application Ser. No. 09/989,808, filed Nov. 19, 2001, entitled "Automatic Generation of Application Program Interfaces, Source Code, Interrupts, and Datasheets for Microcontroller Programming," by Bartz et al.

FIELD OF THE INVENTION

The present invention relates to the field of programmable single-chip systems. Specifically, the present invention relates to a software program which facilitates design of a circuit having programmable system blocks by assisting in programming a microcontroller.

BACKGROUND ART

Microcontrollers allow circuit designers great flexibility in design choice. However, programming the microcontroller to perform the desired functions can be an arduous task. Conventional software for programming microcontrollers is not very robust and does not offer designers many tools to reduce the amount of low level details they need to memorize in order to configure the chip.

Conventional software for programming microcontrollers is very difficult to use. In one system, many windows pop-up as the user attempts to program the microcontroller. Windows pop-up based on flat-organized drop down menus. Each window corresponds to a discrete function. However, many functions are required to do simple tasks. Consequently, the many displayed windows cause confusion because the user needs to keep track of which window is used for which function. Furthermore, it is very difficult to navigate between the windows because some windows overlap others. The user may have difficulty remembering which windows contain what information and which windows receive what information.

Once a circuit designer selects the various functions desired for the circuit, the designer must organize those function within the constraints of the available resources of the hardware with which the design is to be implemented. Conventionally, the circuit designer manually places the functions within the available resources of a programmable device. Unfortunately, this process is tedious and error-prone.

The circuit designer must also design the various interconnections between the selected functions, as well as configure the input/output pins. Conventionally, this can be an arduous and error-prone process. For example, the circuit designer must map the functions he has selected to actual hardware. Multifunction input/output (I/O) ports or pins may be very difficult to configure. They typically have multiple registers that needed to be programmed to configure the pin type as well as the drive characteristics for each of the I/O pins.

Circuits designers also desire to have a datasheet describing the circuit he has designed. Conventionally, the datasheets are generated manually by the designers. Each time the design is modified, a new datasheet must be manually generated. Thus, the designer time is not used efficiently and the possibility of errors in the datasheet is great.

Finally, in many conventional systems, the microcontroller devices are programmed manually. The programmer needs to know all of the registers and other technical information required to instruct the microcontroller to do its embedded functions (e.g., start timing, stop timing, etc.). Manual programming is very error prone and tedious and difficult to error check.

Therefore, it would be advantageous to provide a method which provides for a convenient user-friendly interface for designing a circuit by programming a microcontroller. It would be further advantageous to provide a method which may help reduce errors in programming a microcontroller. Finally, it would be advantageous to provide such a method for programming a microcontroller which does not require the circuit designer to memorize registers and other technical information to invoke functions when programming a microcontroller.

SUMMARY OF THE INVENTION

The present invention provides for a method to facilitate programming a microcontroller. Embodiments provide for a convenient user-friendly interface for designing a circuit by programming a microcontroller. Embodiments provide for a method which may help reduce errors in programming a microcontroller. Embodiments provide for such a method for programming a microcontroller which does not require the circuit designer to memorize registers and other technical information to invoke functions when programming the microcontroller. The present invention provides these advantages and others not specifically mentioned above but described in the sections to follow.

A method to facilitate circuit design is disclosed. In a method embodiment, in response to a selection of a module (e.g., amplifier, timer, PWM, etc.), information related to the selected module is displayed in a designing interface. For example, a schematic and data sheet for the selected module may be displayed. The module may be implementable in one or more digital and/or analog programmable system [on a chip (PSoC)] blocks. Next, in response to a request for a position for the module among available resources (e.g., programmable system blocks), a potential position for the module is computed. The position is displayed on a graphical user interface by mapping the module to one or more programmable system blocks. Additional user modules may then be selected and placed. After allowing the user to configure the circuit by selecting circuit parameters and pin-outs, various items are automatically generated to facilitate programming the microcontroller. For example, application programming interfaces (APIs) for programming an operation of the modules, source code for realizing the modules in the resources, an interrupt vector table, and a data sheet for the circuit may be automatically generated.

Another embodiment allows the user to select a new position (e.g., new programmable system block or blocks) for a selected user module. In response to such a user request, a new potential position is computed and displayed for the user module.

BRIEF DESCRIPTION OF THE DRAWINGS

FIG. 1D is a diagram illustrating an editor workspace allowing a user to edit source code, according to an embodiment of the present invention.

FIG. 3A, FIG. 3B, and FIG. 3C are diagrams illustrating the position of a user module being iterated to new positions, according to an embodiment of the present invention.

FIGS. 7A–7C are an exemplary file illustrating a source code table that may be automatically generated, according to an embodiment of the present invention.

FIGS. 8A–8B are an exemplary file showing source code that may be automatically generated, according to an embodiment of the present invention.

FIGS. 9A–9B are an exemplary file showing an application programming interface (API) that may be automatically generated, according to an embodiment of the present invention.

FIG. 10 and FIG. 11 are exemplary files showing application programming interfaces (APIs) that may be automatically generated, according to embodiments of the present invention.

FIG. 12A and FIG. 12B illustrate an exemplary interrupt handler file which may be automatically generated, according to an embodiment of the present invention.

FIG. 13A illustrates interrupt vectors that may be automatically generated in a startup file to build an interrupt vector table, according to an embodiment of the present invention.

FIG. 13B is a table illustrating how the interrupt vectors of FIG. 13A map to interrupts, according to an embodiment of the present invention.

DETAILED DESCRIPTION OF THE INVENTION

In the following detailed description of the present invention, a method for facilitating programming a microcontroller, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1A:
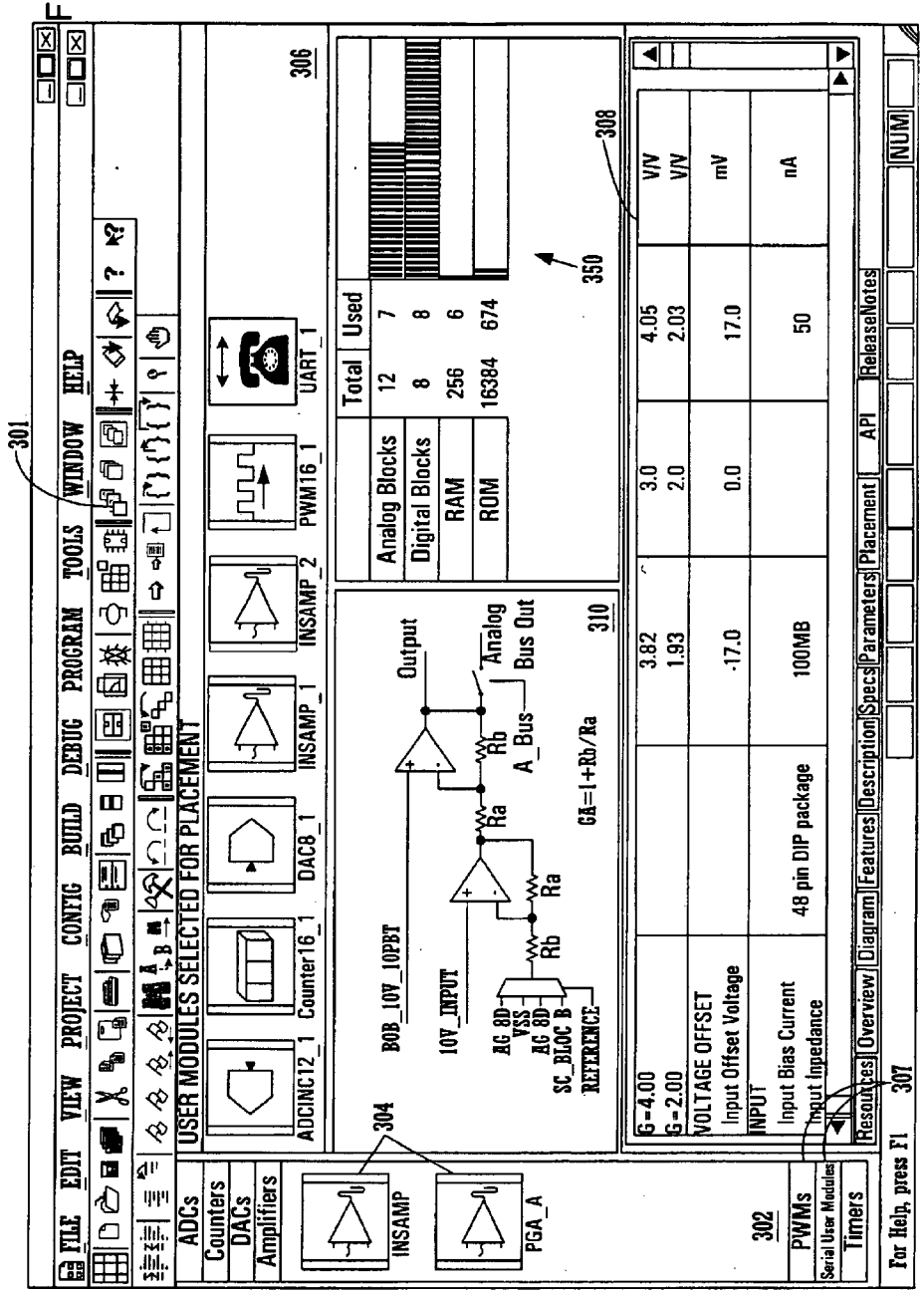
FIG. 1A is a diagram illustrating a graphical user interface allowing a user to select a user module and display its schematic and its data sheet, according to an embodiment of the present invention.

To facilitate the design process, embodiments provide various workspaces. For example, a user may move between a user module selection work-space, a user module placement workspace, and a user module pin-out work-space. FIG. 1A illustrates an exemplary graphical user interface which allows a user to select user modules 304. Regarding user module selection, the workspace provides a user module window 302 for a catalog of available user modules 304, a listing 306 of selected user modules 304, a schematic 310 of a selected user module 304, plus its datasheet 308. The user may click on a user module 304 of user module window 302 to designate one. A histogram 350 (e.g., a series of cumulative bar charts or graphical indicators) of available resources on the target device (e.g., a microcontroller) Is also shown. The datasheet 30B is tabbed for easy navigation therethrough. The various windows may be displayed simultaneously for easy reference back-and-forth. Button 301 may be used to automatically generate source code for the project.

Figure 1B:
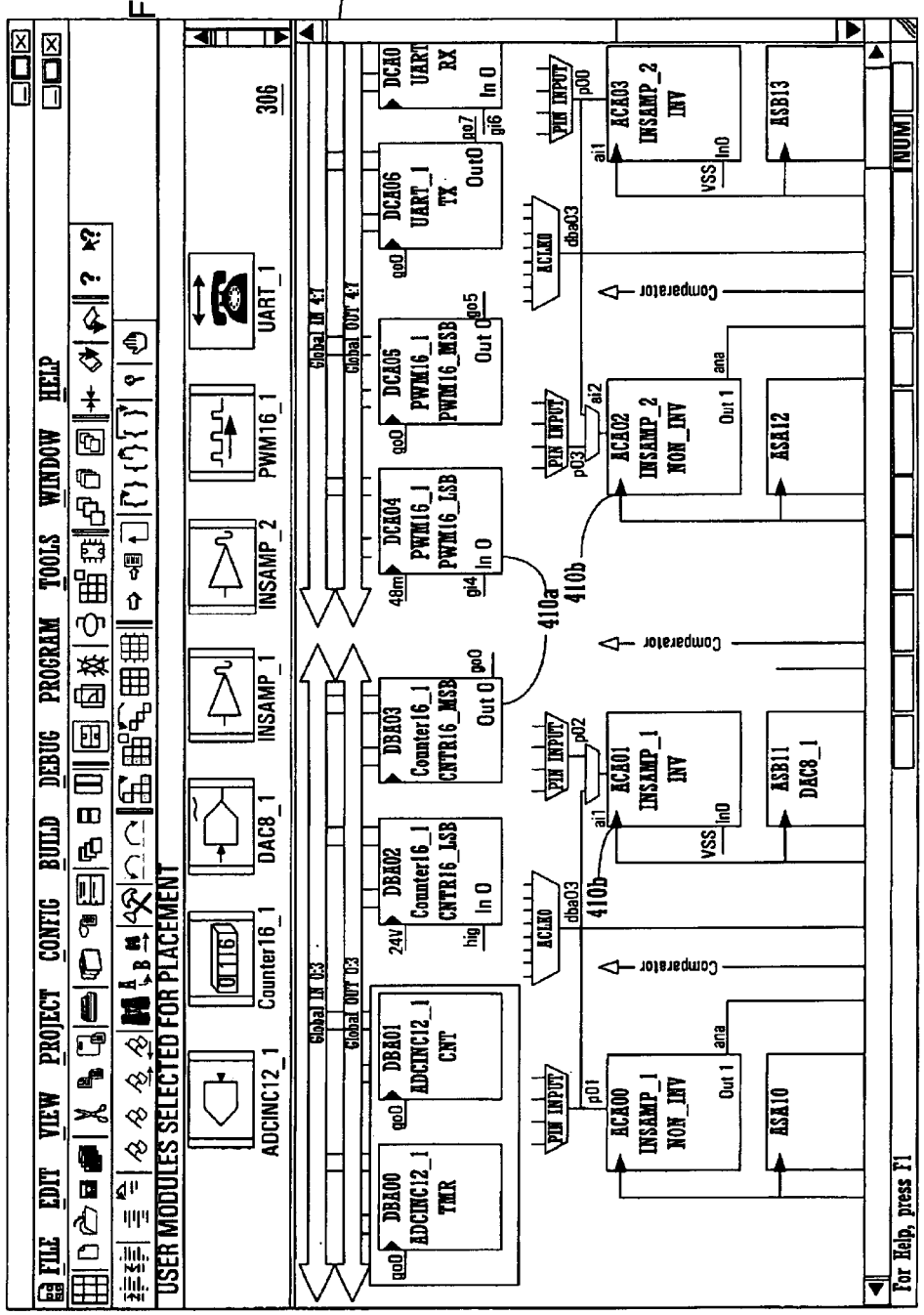
FIG. 1B is a diagram illustrating a graphical user interface allowing a user to place a user module in a graphical user interface, according to an embodiment of the present invention.

Referring now to FIG. 1B, a user module placement work-space includes a resource graphic window 360 illustrating the placement of user modules 304 with respect to the available resources (e.g., available programmable system blocks 410 of a microcontroller) in a hardware layout graphical display. Throughout this application the term resource image may denote the blocks 410 upon which user modules 304 are placed in window 360. As the resource images may represent programmable system blocks in one embodiment, the resource images may be referred to as programmable system blocks for convenience. It will be understood that the resource images may represent other resources however, as the present invention is not limited to implementing the user modules 304 in programmable system blocks. FIG. 1B shows a number of digital programmable system blocks 410*a* along the top row (e.g., the blocks labeled DBA00, DBA01, etc.), as well as four columns of analog programmable system blocks 410*b* (e.g., the blocks labeled ACA00, ACA01, etc.). The present invention is well suited to using any number of analog and digital programmable system blocks 410. Furthermore, the blocks in graphic window 360 are not limited to representing programmable system blocks.

A single user module 304 may map to one or more programmable system blocks 410. Color coding (not shown) may be used to relate the user modules 304 of selected modules window 306 with their schematic placement in resource graphic window 360. The analog 410*b* and digital 410*a* programmable system blocks may be more generally defined as two different classes to which a user module 304 maps. The present invention is well-suited to having many different classes.

Figure 1C:
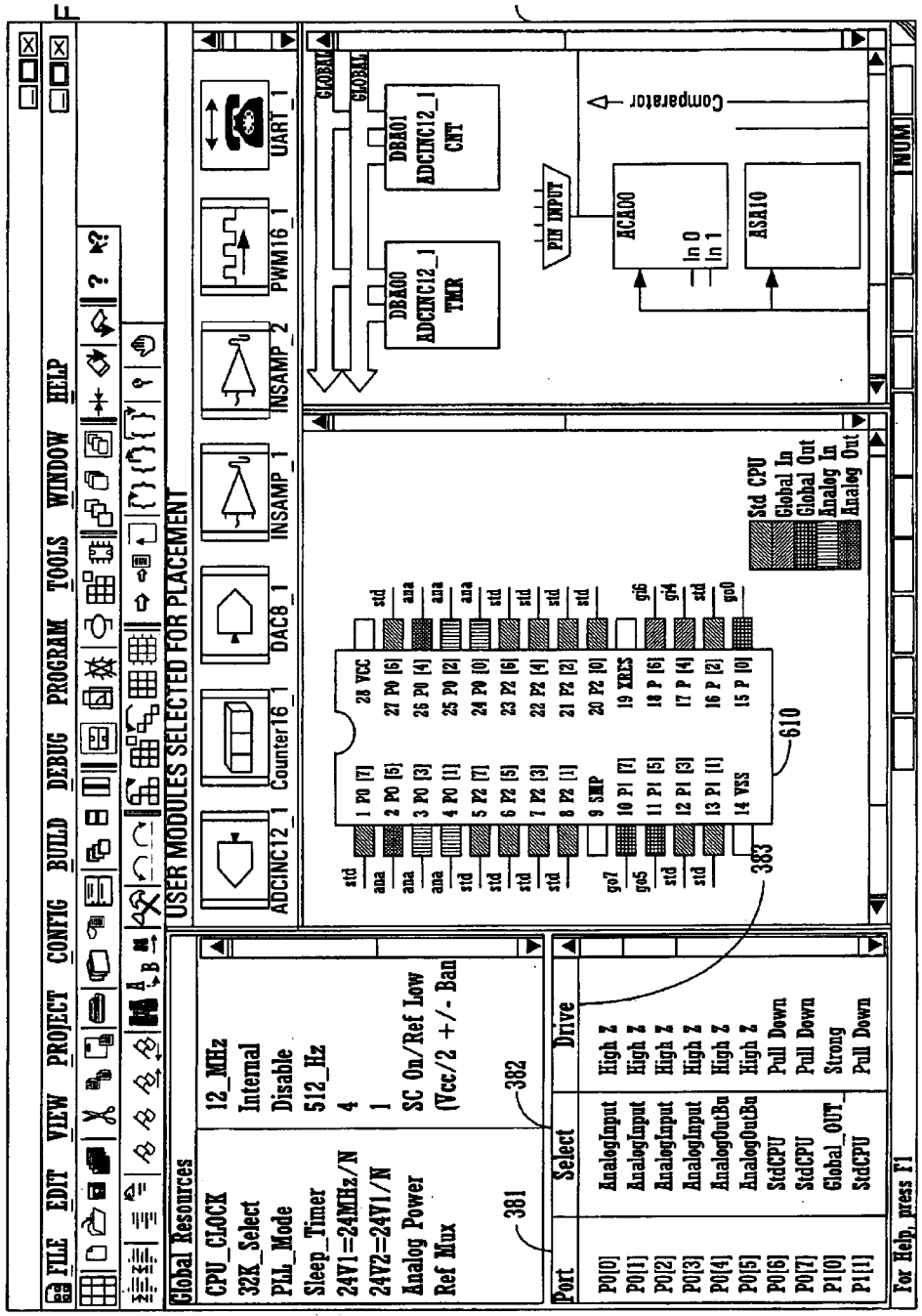
FIG. 1C is a diagram illustrating a graphical user interface allowing a user to configure pins, according to an embodiment of the present invention.

Referring now to FIG. 1C, a pin-out configuration workspace is shown. The pin-out configuration work-space allows the user to connect programmable system blocks 410 to input/output (I/O) pins, as well as configure the I/O pins' drive characteristics. In one embodiment, a pin configuration window 380 may be used to configure pins. Pin configuration window 380 has a port column 381, a select column 382, and a drive column 383. In another embodiment, a user may set pin configurations by clicking on the GUI of the chip 610. The operation of these features will be discussed more fully herein.

Figure 1D:
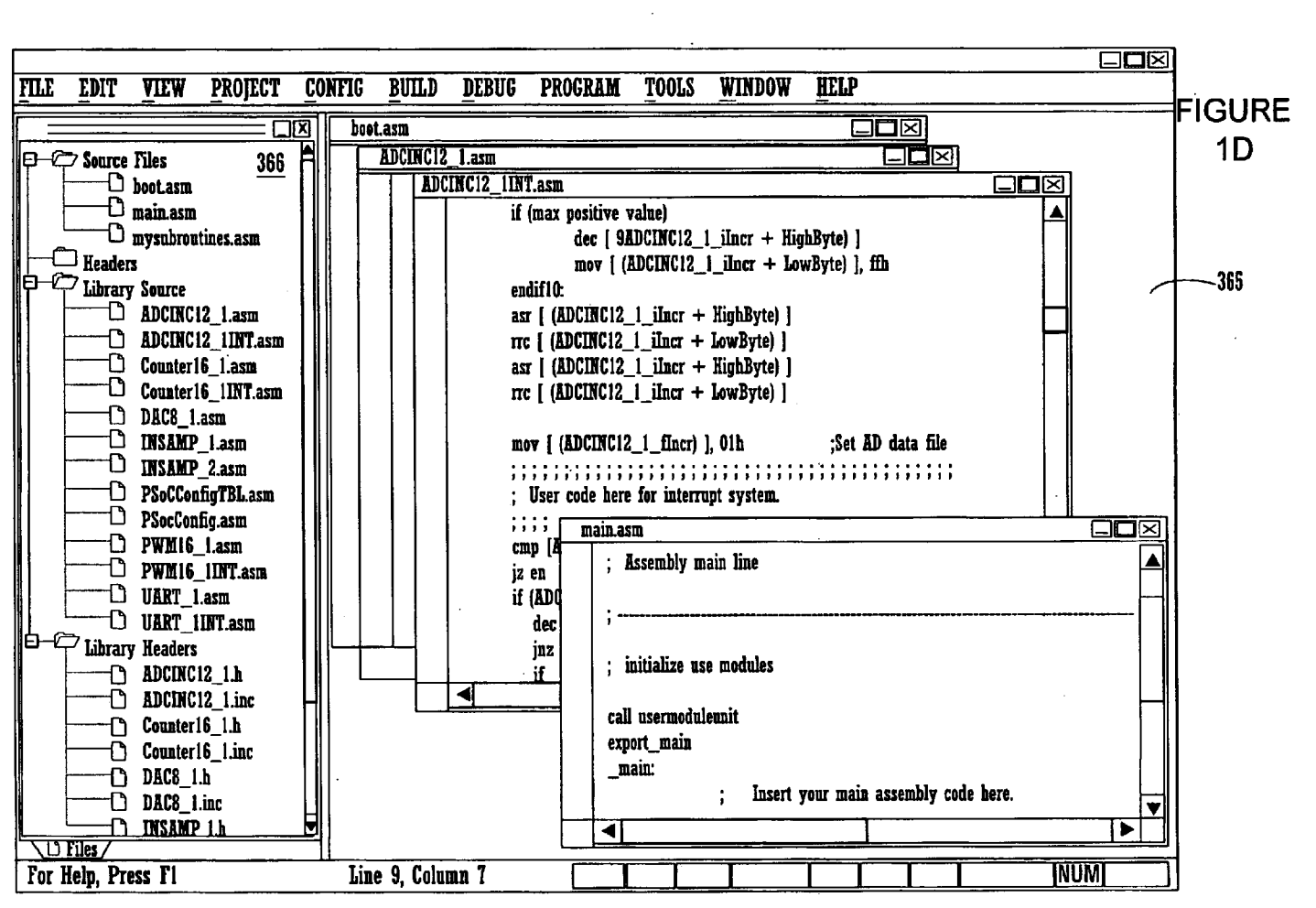

Referring now to FIG. 1D, after the user has configured the device, embodiments automatically generate source code, which may be edited by the user. A directory window 366 (source tree window) provides a listing of various exemplary source code files and API files that may be automatically generated. An editor workspace 365 is provided for a user to edit various files. In this fashion, a user may program a microcontroller without having detailed knowledge of all the registers in the microcontroller.

Figure 14:
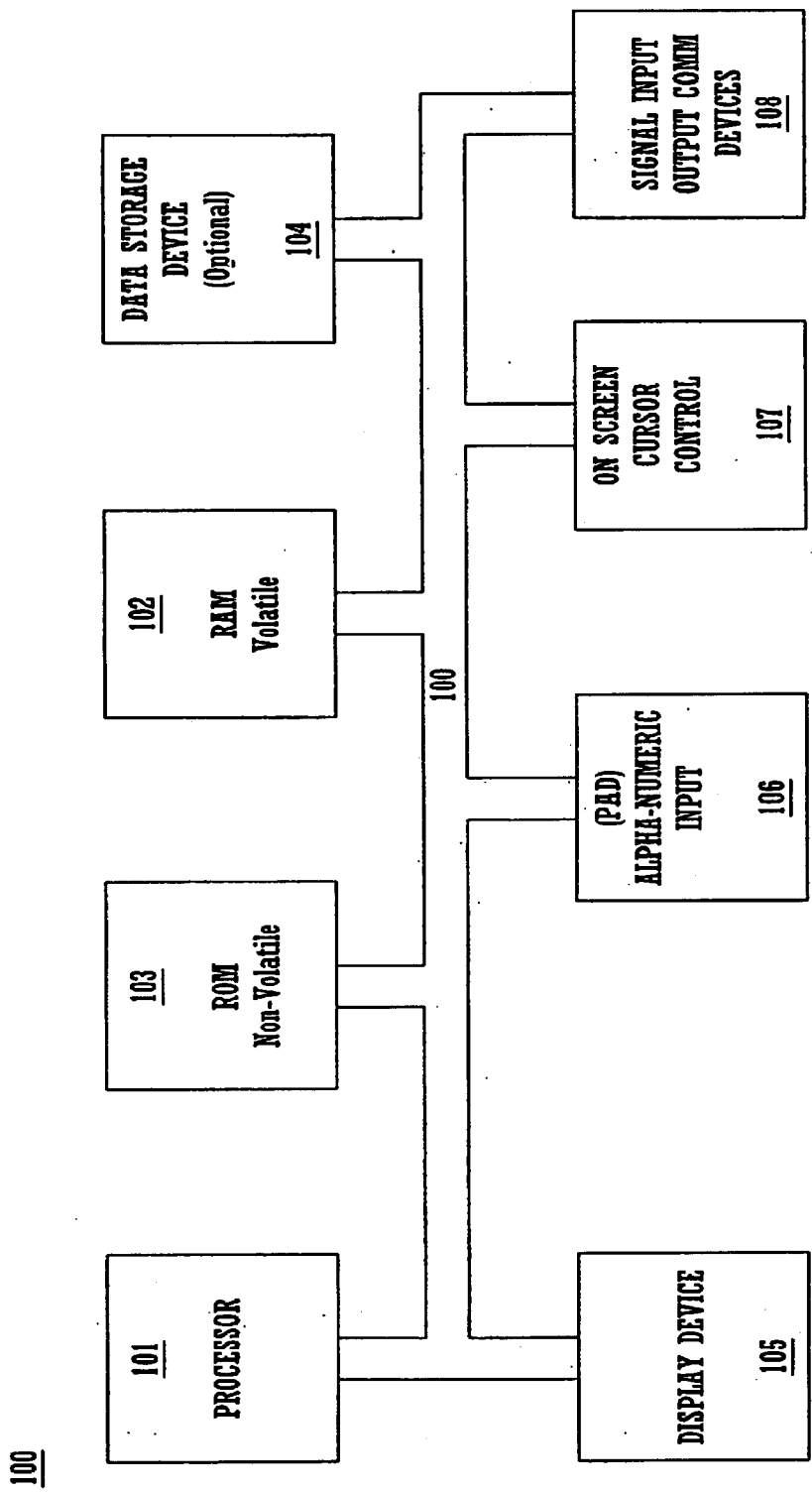
FIG. 14 is a schematic of a computer system, which may be used to implement embodiments of the present invention.

Reference will now be made to the flowchart of FIG. 2 and FIGS. 1A–1D and FIGS. 3–6D. Steps of process 200 may be implemented on a general purpose computer, such as illustrated in FIG. 14. Referring now to step 210 of FIG. 2 and FIG. 1A, a selection 302 of available user modules 304 is displayed. A user module 304 may represent an accessible, pre-configured function that once programmed and placed will work as a peripheral to a target device. For example, a user module may be an amplifier, pulse width modulator, counter, digital-to-analog converter, etc. The user module window 302 of FIG. 1A shows amplifiers which may be selected. The user may select one of the 'buttons' 307 to cause the user module window 302 to display other user modules 304. (For example, to display Timers, Pulse Width Modulators, etc.).

Figure 2:
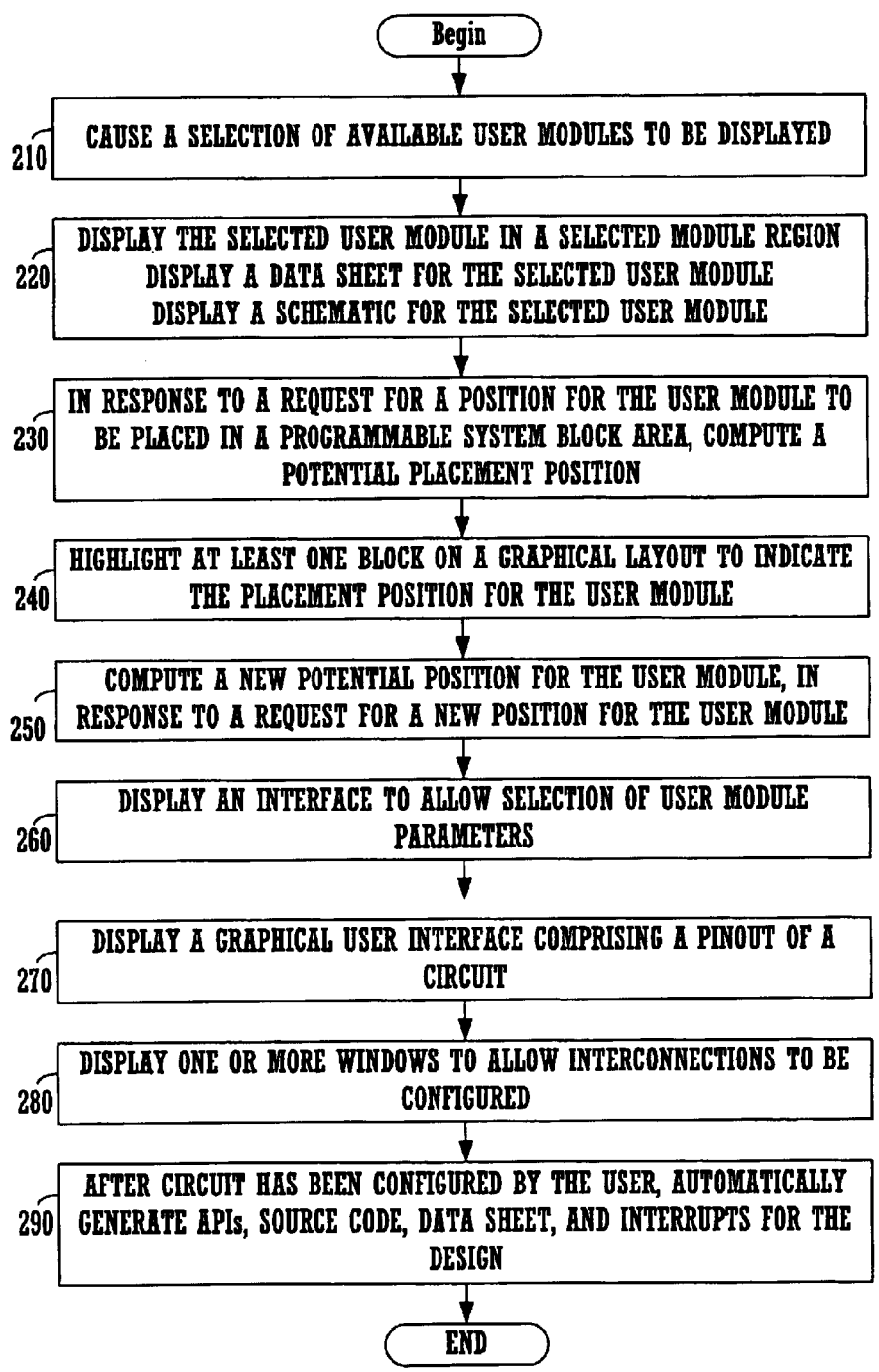
FIG. 2 is a flowchart illustrating steps of a process of facilitating programming a microcontroller, according to an embodiment of the present invention.

Referring still to FIG. 2 and FIG. 1A, in step 220 in response to a user selection of one of the user modules 304, the selected user module 304 is displayed in a selected user module region 306 and a data sheet 308 and schematic 310 are displayed for the selected user module 306. FIG. 1A shows a schematic 310 for an instrumentation amplifier, along with its datasheet 308. The user is allowed to add more user modules 304 to the design by selecting more user modules 304 and causing them to be added to the selected user module area 306.

Referring now to step 230 of FIG. 2, in response to a request from a user for a potential (e.g., valid) position for a selected user module 304, a position is computed. The computer automatically determines the possible placements based on the available resources and the number of programmable system blocks 410 and the types of programmable system blocks 410 that are required for the unplaced user module 304. Because the user does not need to determine the potential placements, designing the circuit is faster and less error prone than conventional methods which do not provide such guidance.

User modules 304 may require multiple programmable system blocks 410 to be implemented. In some cases, user modules 304 may require special ports or hardware which may limit which programmable system blocks 410 can be used for their implementation. The process of mapping a user module 304 to programmable system blocks 410, such that the user module 304 is realized within the microcontroller, may be referred to as "user module placement." An embodiment automatically determines the possible placements of a user module 304 based on an Extensible Markup Language (XML) user module description and the hardware description of the underlying chip. However, the present invention is not limited to using XML descriptions. The potential placement positions may be automatically inferred based on the XML input data. Therefore, the placement process of embodiments of the present invention is data driven.

In step 240, one or more programmable system blocks 410 are highlighted to indicate a possible position for the user module 304 based on, for example, XML input data. The placement is shown in a graphical hardware layout diagram 360 by highlighting the programmable system blocks 410 involved. For example, referring to FIG. 1B, the ADCINC12_1 user module 304 has been selected for placement in the window 360. This user module 304 requires two digital blocks 410*a* and one analog block 410*b*. The digital programmable system blocks 410*a* labeled DBA00 and DBA01 are highlighted to indicate a possible position for the ADCINC12_1 user module 304. Referring now to FIG. 3A, the analog programmable system block 410*b* labeled ASB20 is highlighted to indicate that it is a possible position for the analog portion of the ADCINC12_1 user module 304. Embodiments may use color coding to associate the highlighting color with a unique color assigned to that user module 304.

User module placement is described in co-pending U.S. patent application Ser. No. 09/989,762, filed concurrently herewith, entitled "A SYSTEM AND METHOD FOR PERFORMING NEXT PLACEMENTS AND PRUNING OF DISALLOWED PLACEMENTS FOR PROGRAMMING AN INTEGRATED CIRCUIT," by Ogami et al., and assigned to the assignee of the present invention and incorporated herein by reference.

Figure 3B:
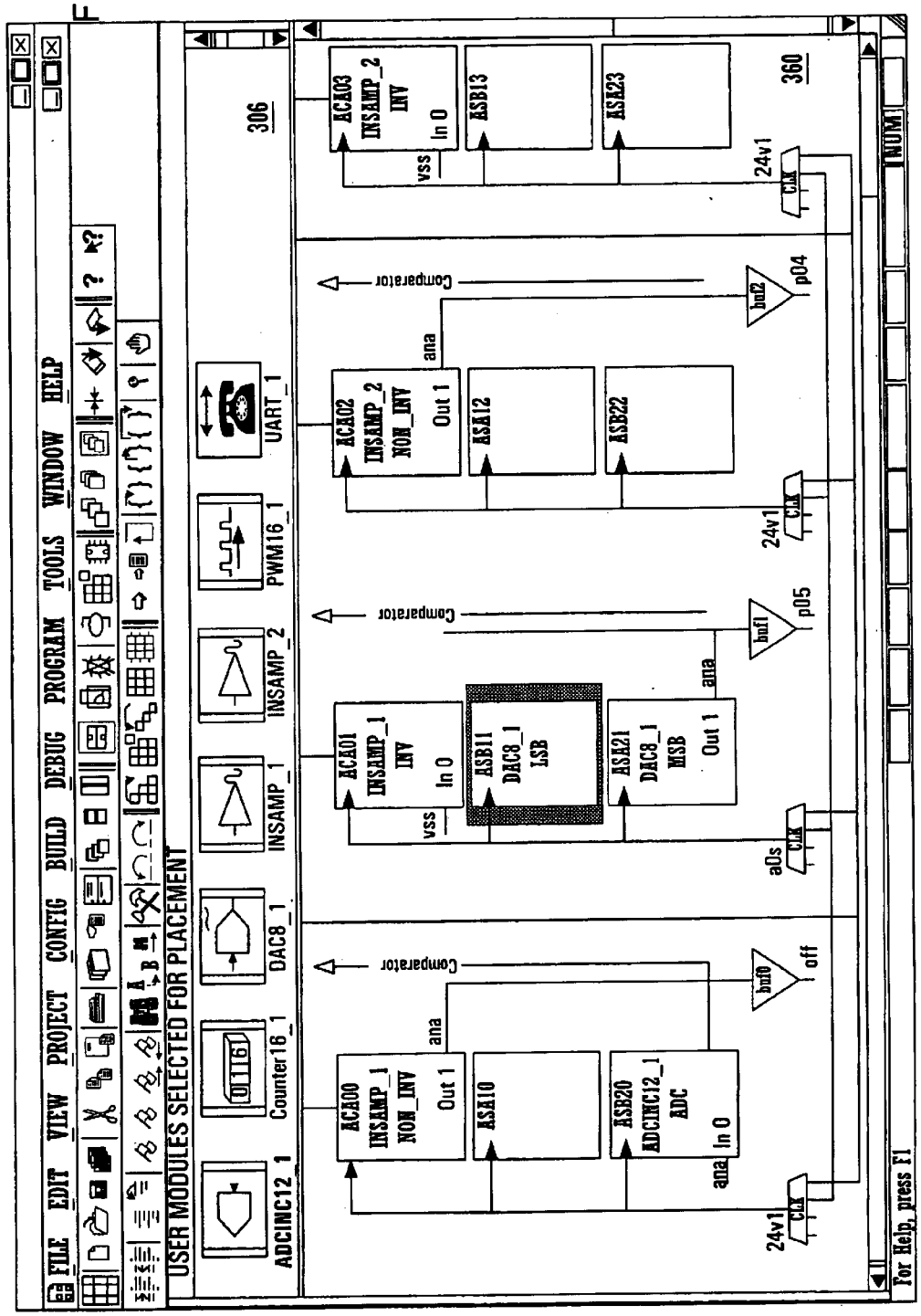
Figure 3C:
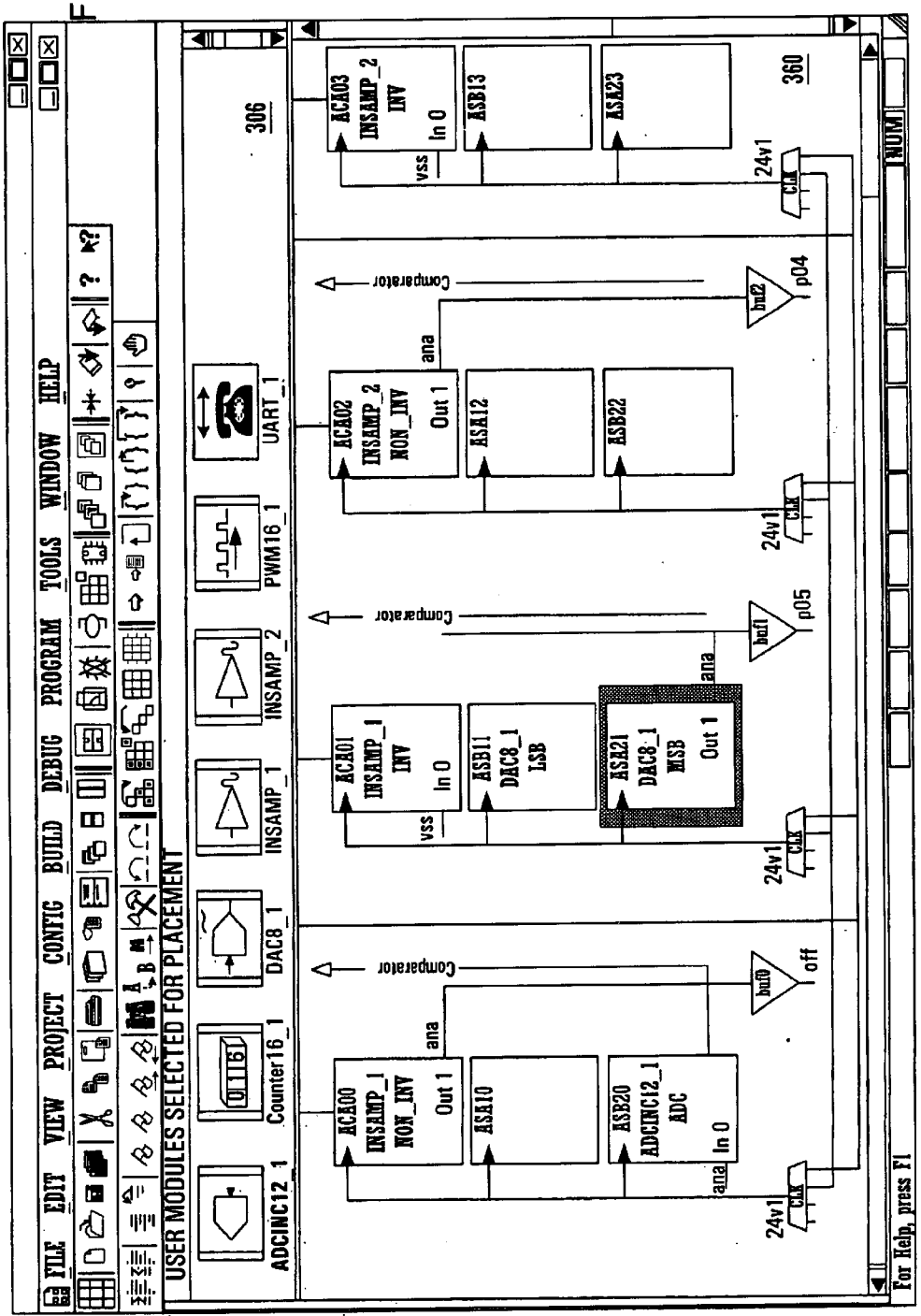

Referring now to FIGS. 3A–3C and to step 250 of FIG. 2, after placing a user module 304, a user may desire to move it to another programmable system block 410 (or blocks). In step 250, a new possible position for a user module 304 is computed, in response to a user request for a new position for the user module 304. The user may select a next position button 371 to cause this to occur. FIGS. 3A–3C illustrate three possible positions for the analog portion of the ADCINC12_1 user module 304. The user may then click on a place module button 372 to place the module 304. Placements that are incompatible with the user module requirements (e.g., characteristics) are automatically pruned out by the software and therefore are not displayed as valid placements. In one embodiment, all positions are shown to the user, sequentially, each time the next placement icon 371 is selected. However, if a potential placement involves a programmable system block 410 that has already been used (e.g., by another placed user module 304), then in these cases the place user module icon 372 is grayed out indicating that this placement is only valid if the resources were vacant. This allows the user to see all possible placements.

If a user module 304 consists of both and digital 410*a* and analog blocks 410*b*, the system may show next positions for the digital 410*a* and analog blocks 410*b* separately. Thus, the user may change the placement of one without affecting the other. For example, the position of the analog block 410*b* of the ADCINC12_1 user module 304 is moved in FIGS. 3A–3C. However, the digital blocks 410*a* for that module 304 do not move at this time. The user may separately seek a new position for those blocks 410 (e.g., digital blocks DBA00 and DBA01 in FIG. 1B). Embodiments allow for multiple different classes to be separately placed. For example, rather than placing analog and digital blocks separately, the user may place memory, routing, and I/O separately in an embodiment which is not illustrated in the Figures. The present invention is well-suited to placing any number of classes separately. Furthermore, when placing a user module 304 with multiple classes, the system may highlight active resource images (e.g., those currently being placed) in a different color than inactive resource images.

The next position process is iterative, in that each time the next position button 371 is clicked, another possible placement will be determined and highlighted, etc., until the user module 304 is placed.

User module next placement is described in co-pending U.S. patent application Ser. No. 09/989,781, filed concurrently herewith, entitled "SYSTEM AND METHOD FOR DECOUPLING AND ITERATING RESOURCES ASSOCIATED WITH A MODULE," by Ogami et al., and assigned to the assignee of the present invention and incorporated herein by reference.

Steps 210 through 250 may be repeated to allow the user to add more user modules 304. Each time a new user module is selected, a system resource window may be updated. Referring again to FIG. 1A, for each user module 304 selected, the system updates the data in the Resource Manager window 350 with the number of occupied programmable system blocks 410, along with RAM and ROM usage used by the current set of "selected" user modules 304. The system may also prevent a user from selecting a user module 304 if it requires more resources than are currently available. Tracking the available space and memory of configurations for the design may be performed intermittently during the whole process of configuring the microcontroller. Embodiments provide a live graph tracking the programmable system blocks 410 used by percentage. The RAM and ROM monitors may track the amount of RAM and ROM required to employ each selected user module 304.

Figure 4:
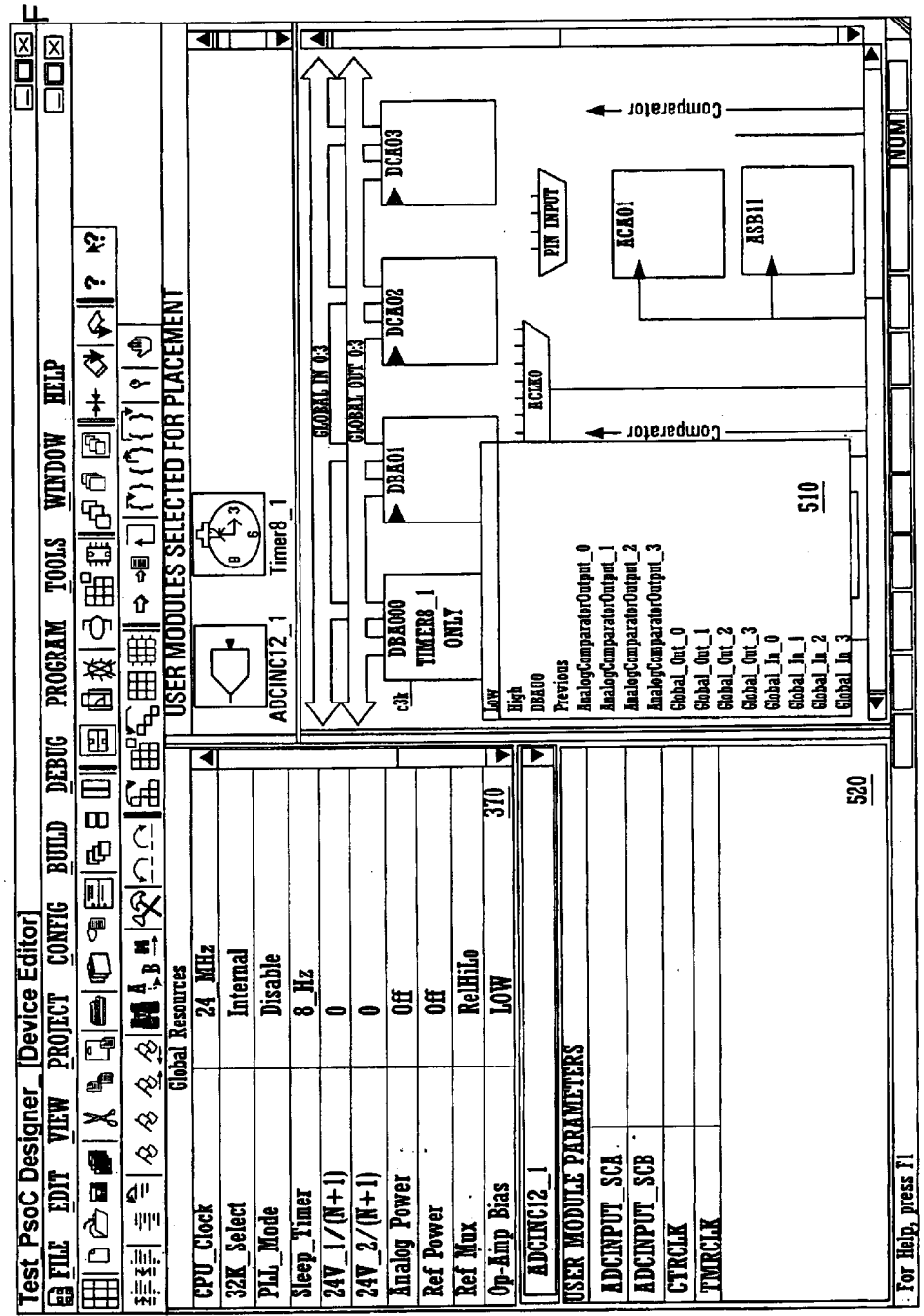
FIG. 4 is a diagram illustrating a graphical user interface allowing selection of user module parameters, according to an embodiment of the present invention.

After the user has selected one or more user modules 304, the user may select global parameters and user module parameters such as, for example, the gain of an amplifier, a clock speed, etc. Referring now to FIG. 4 and to step 260 of FIG. 2, in response to a user clicking on a region on a programmable system block 410 an interface 510 is displayed which allows the setting of user module parameters. For example, the user may place "the cursor" over the lower-left corner of a programmable system block 410 to set input parameters. The system may display a superficial chip or a changed cursor in response to this. The user may then left-click a mouse, for example, to bring up a user module parameter window 510 to configure the user module input parameters. The process may be repeated in the lower-right corner of the programmable system block 410 for output parameters and on the upper-left corner for clock parameters. The present invention is not limited to these steps for bringing up a user module pop-up window 510, however. The system may then display the selected parameters in a user module parameter window 520. Various pop-up windows may be data driven in that the contents of the pop-up window may depend on, for example, the user module 304 selected. Alternatively, user parameters may be set in the user module parameter window 520.

When the user module 304 is placed (e.g., instantiated) on a particular programmable system block 410 the register settings and parameter settings may be mapped to a physical register address on the chip. This may also associate interrupt vectors that the user module 304 uses based on the programmable system block 410. Each of the digital blocks 410*a* maps to one vector and each column of analog blocks 410*b* maps to one vector. Once the user modules 304 are placed and the parameters are set, all the physical address registers that are associated with that user module 304 are fixed and the register values are determined.

In addition to setting user module parameters, the user also may set global parameters. For example, referring still to FIG. 4, a global resource window 370 is seen. Global resources may be hardware settings that determine the underlying operation of the part (e.g., the CPU_Clock, which may designate the speed in which the microcontroller processes). These settings may be used to program global registers, which may be in addition to the registers set by configuring the user module parameters.

Figure 5A:
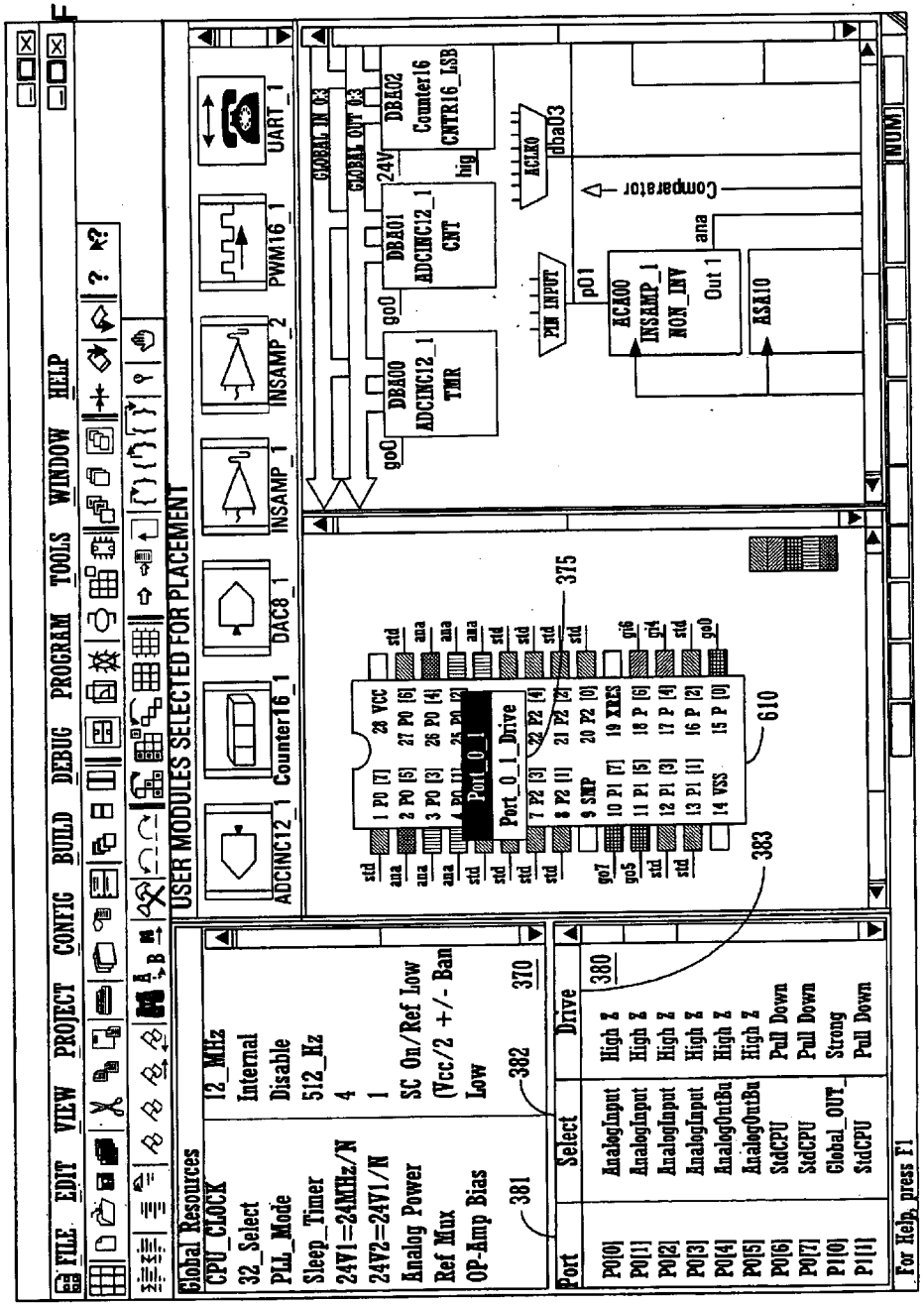
FIG. 5A, FIG. 5B, and FIG. 5C are diagrams illustrating graphical user interfaces for facilitating configuring I/O pins, according to an embodiment of the present invention.
Figure 5B:
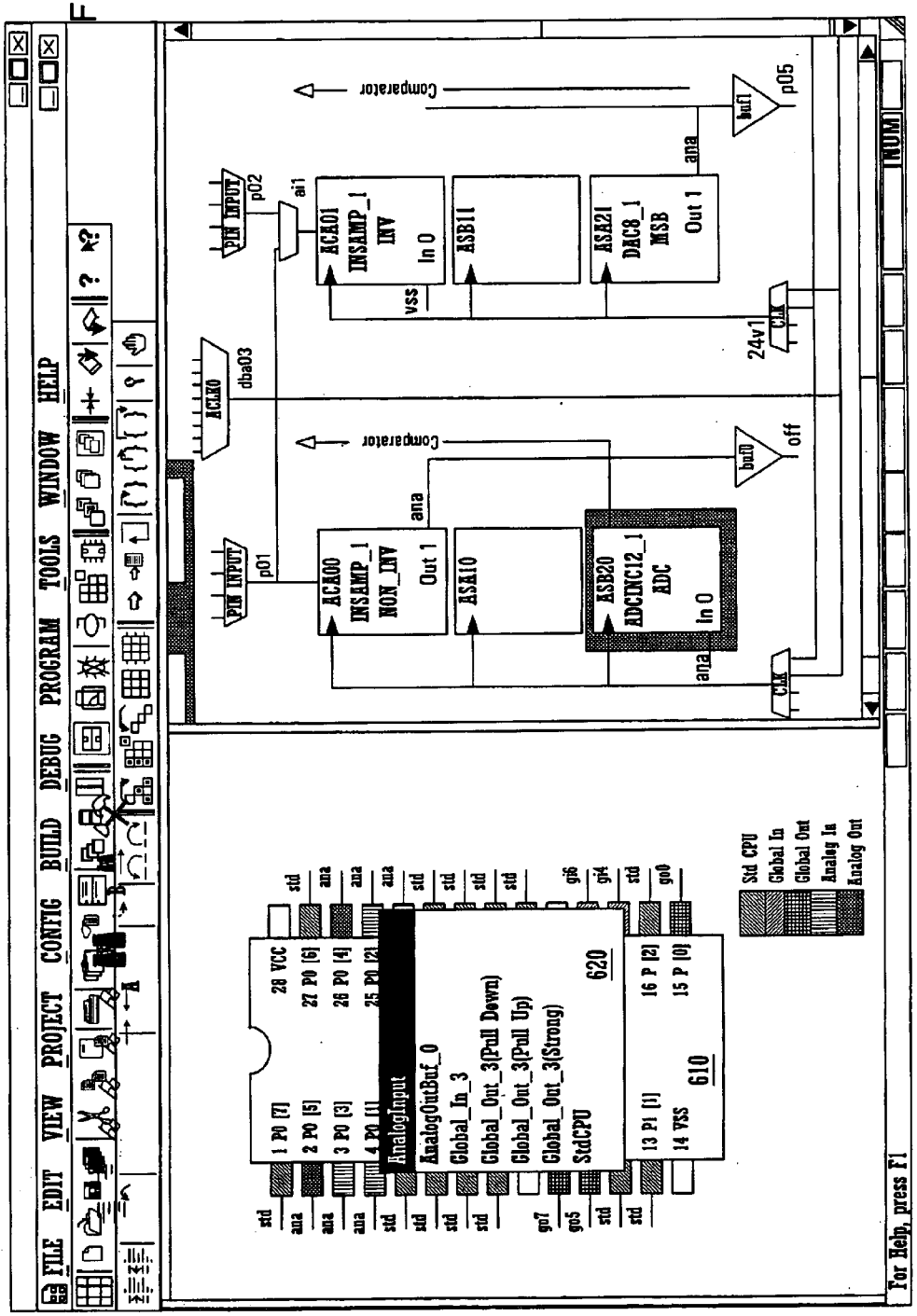
Figure 5C:
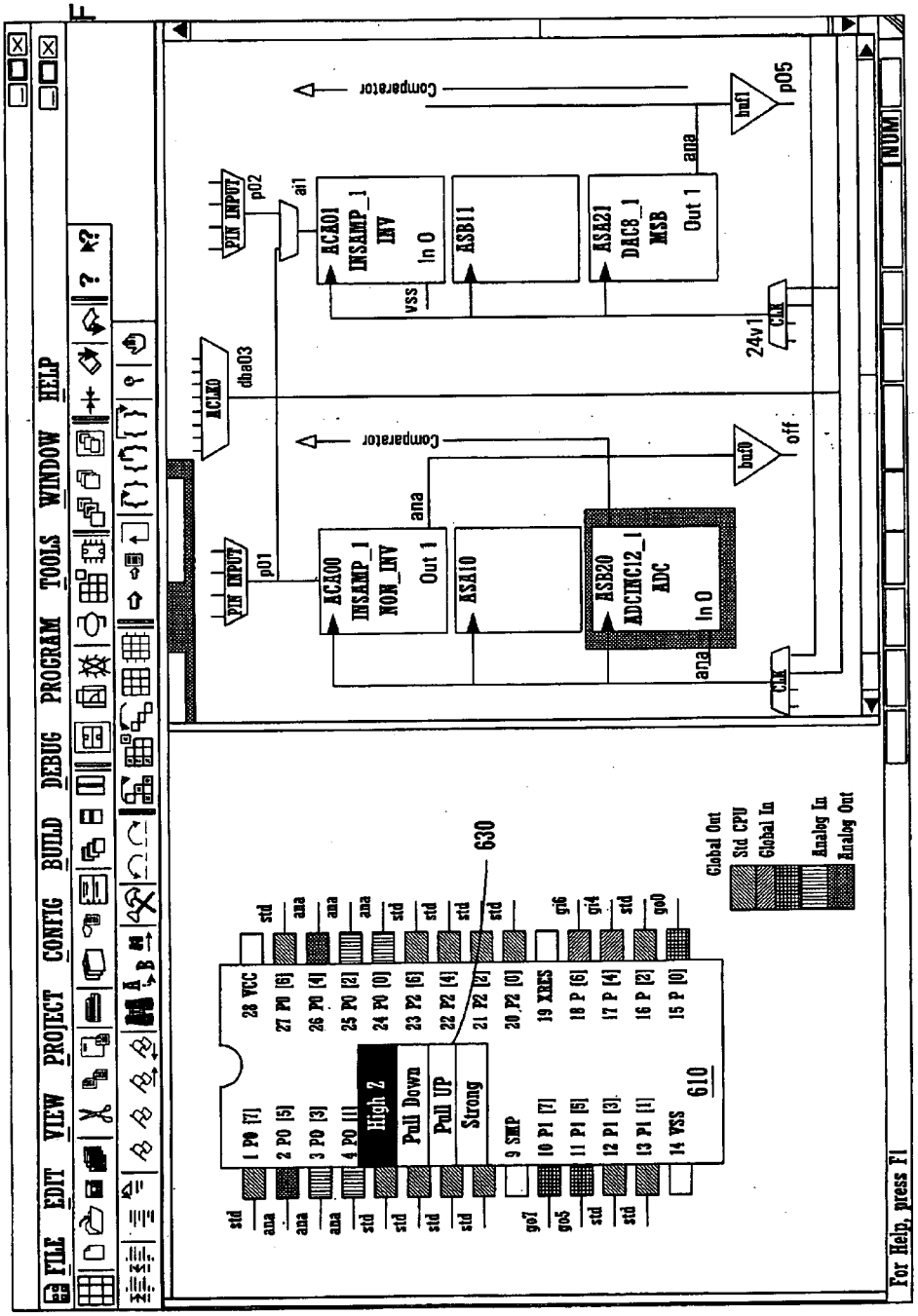

One embodiment provides for a graphical user interface for facilitating the configuration of I/O pins in a microcontroller software design tool. Referring now to FIGS. 5A–5C and to step 270 of FIG. 2, a GUI is displayed to allow input/output pins to be configured. Each pin has a pin number associated therewith. Referring to FIG. 5A, when the user clicks near a pin of GUI 610, a small window 375 opens allowing the pin type (e.g., Port_0_1) and drive type (e.g., Port_0_1_Drive) to be configured. Referring now to window 620 of FIG. 5B, the pin type may include analog input or analog output or global bus, etc. Referring now to window 630 of FIG. 5C, the drive type may include high-z, pull-up, pull-down, strong, etc. The windows 620 and 630 may include a list that contains items that can be selected using the cursor. When the cursor is clicked outside of the windows 620 or 630, then the windows 620, 630 disappear automatically.

In another embodiment, a pin parameter table is provided to configure the pins. Referring to FIG. 5A, the pin parameter table 380 includes a column for pin number 381, pin type 382 and drive type 383. The entries in the pin parameter table 380 can be selected by the cursor and again, the relevant window will open so that pin type or drive type can be selected. Therefore, the GUI of the chip 610 or the pin parameter table 380 can be used to configure the pins.

Each pin may contain three register values for configuration of both pin type and drive type. By using this user interface, the user need not be concerned with remembering register values, etc., for configuring the pins. Further, the user need not worry about how the configuration is to be done using the registers.

Pin configuration is described in co-pending U.S. patent application Ser. No. 10/032,986, filed Oct. 29, 2001, entitled "PIN-OUT CONNECTIONS/DRIVE LEVELS DIRECTSET BY DROP DOWN LIST," by Ogami et al., and assigned to the assignee of the present invention and incorporated herein by reference.

Figure 6A:
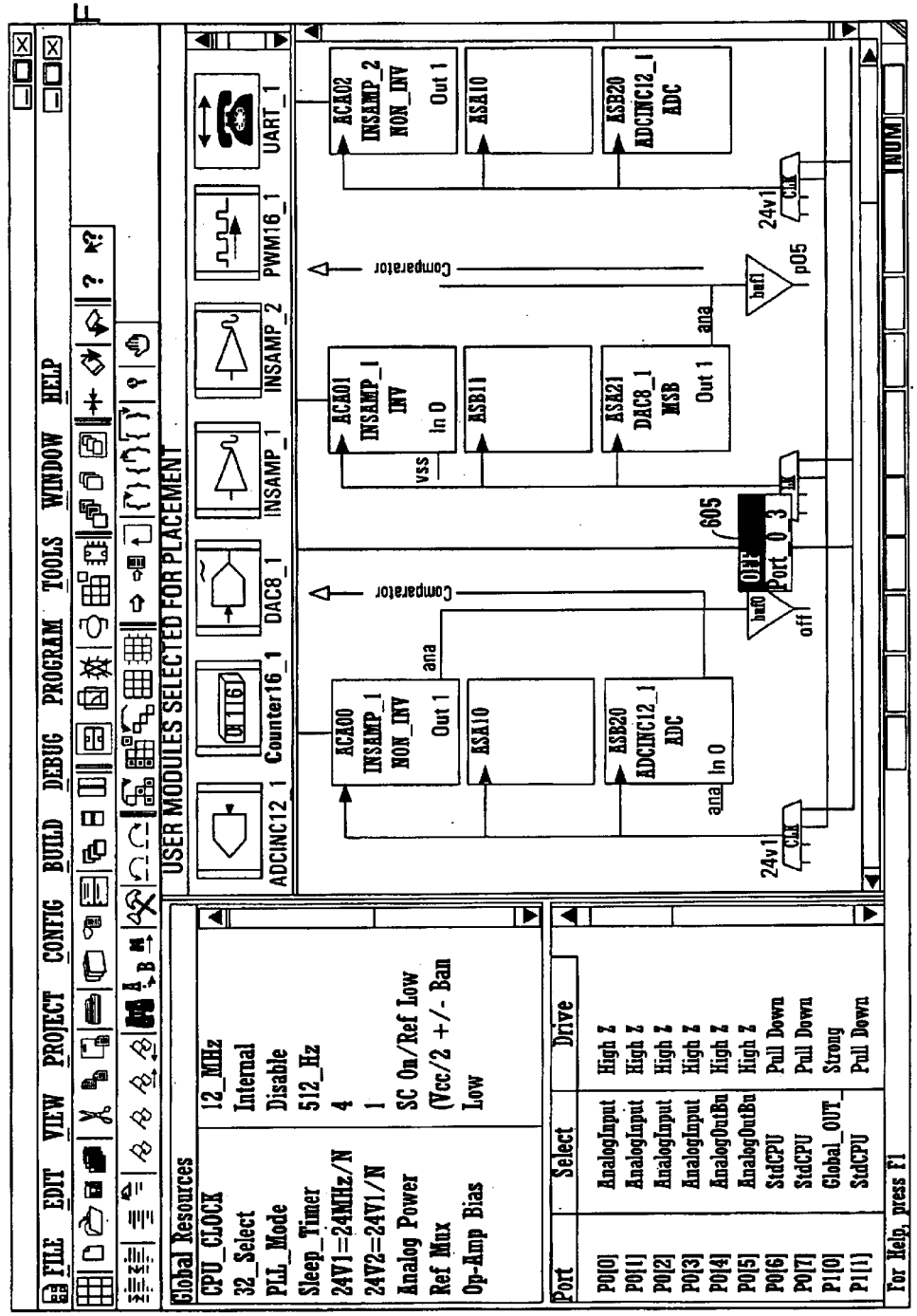
FIG. 6A, FIG. 6B, FIG. 6C, and FIG. 6D are illustrations of graphical user interfaces for configuring interconnections between programmable system blocks, according to embodiments of the present invention.
Figure 6B:
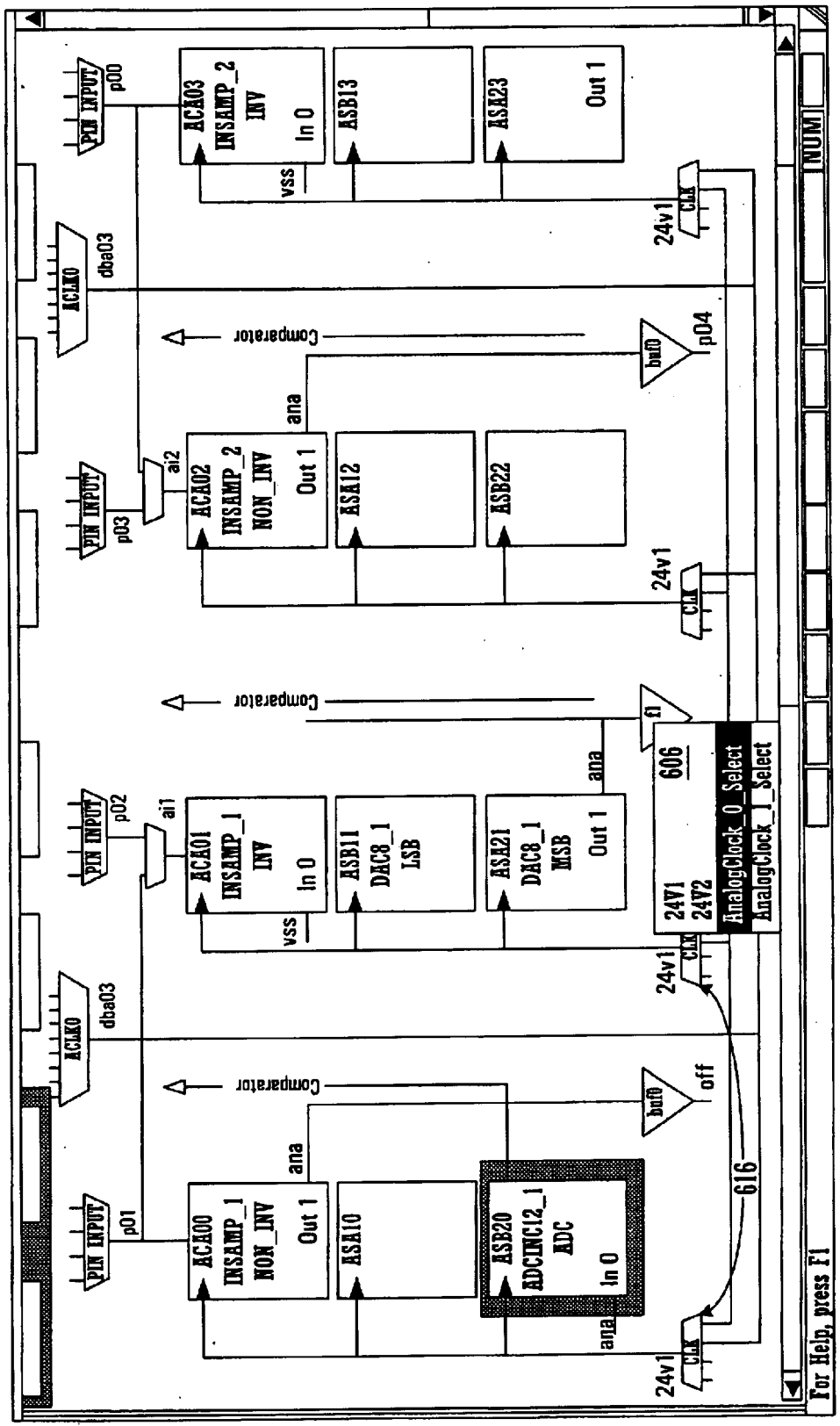
Figure 6C:
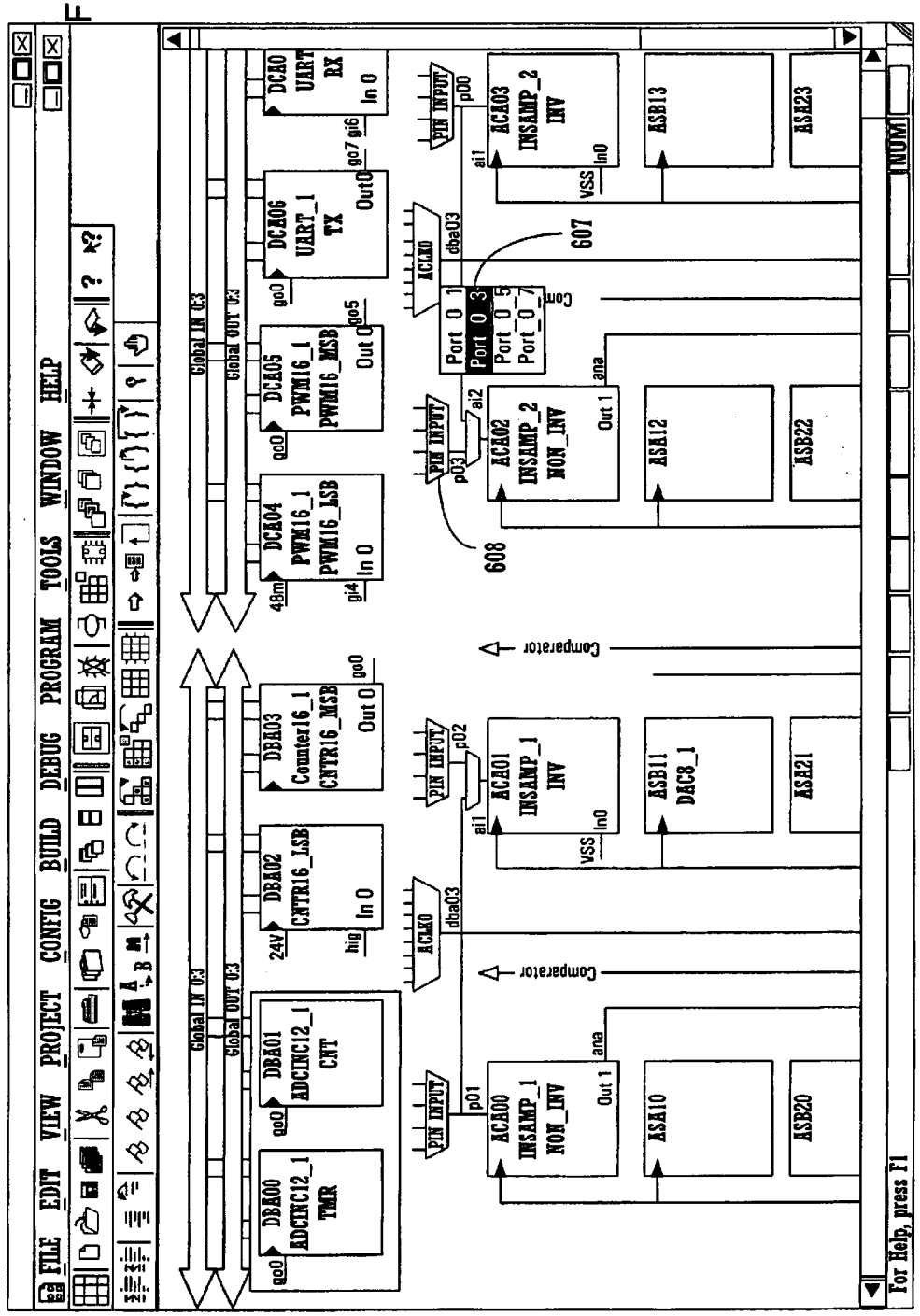
Figure 6D:
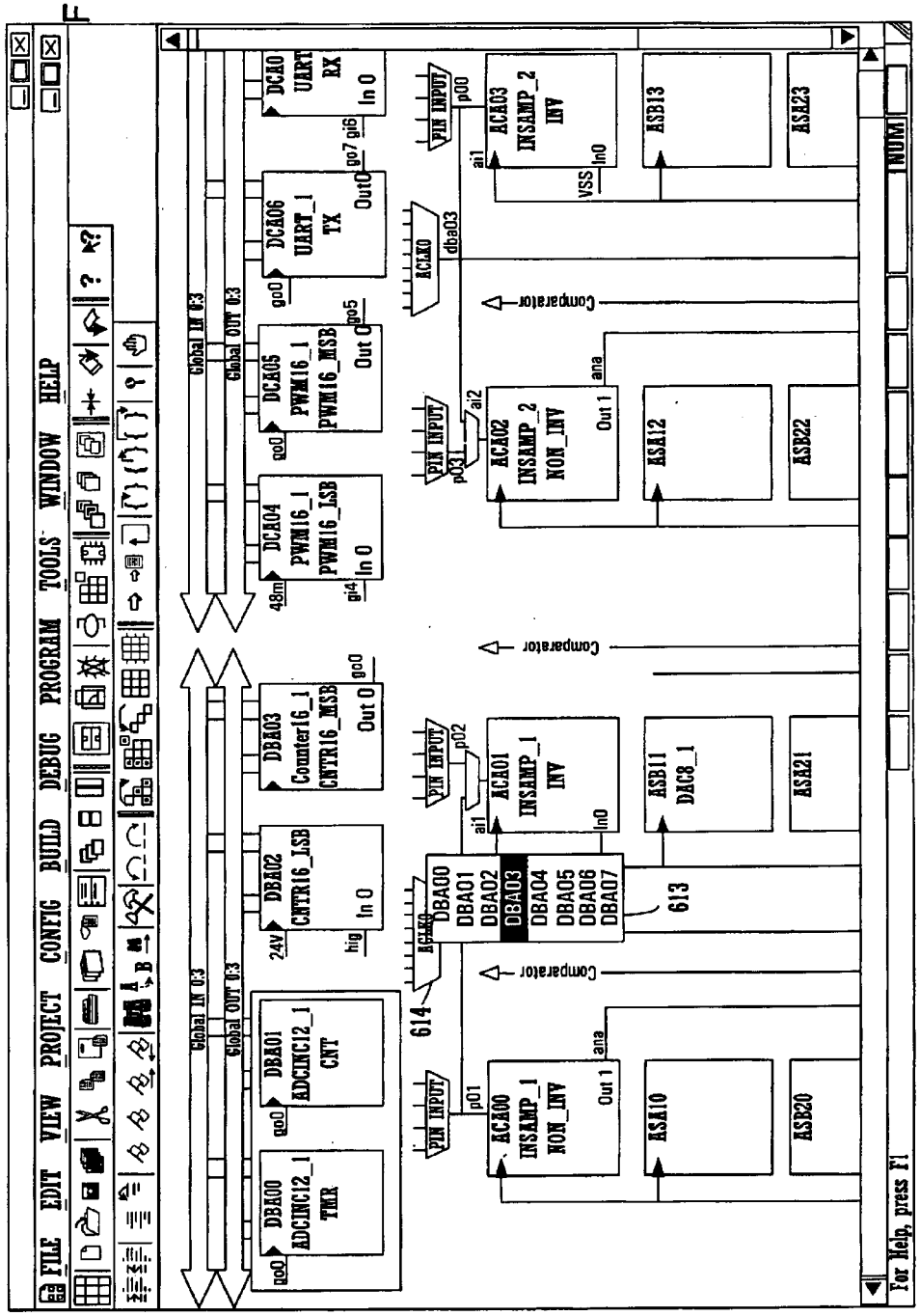

Referring now to FIGS. 6A–6D and to step 280 of FIG. 2, embodiments provide many different windows to assist the user in setting various parameters to specify interconnectivity of programmable system blocks 410. Referring to FIG. 6A, the user may cause window 605 to appear to configure the analog output buffer. Referring to FIG. 6B, the user may cause a clock window 606 to appear by clicking on a clock MUX 616 to configure which clock will be the input to a column of analog programmable system blocks 410b. Referring to FIG. 6C a port selection window 607 is shown. The port selection window 607 maybe made to appear by clicking on or near the pin input MUX 608. The user may then select the input port. Referring now to FIG. 6D, the user may click on or near the analog clocking MUX 614 to cause a window 613 to appear to select which digital programmable system block 410a should be selected by the clock MUX (616 of FIG. 6B).

Referring now to step 290 of FIG. 2, after the circuit has been configured by the user, the system automatically generates Application Program interfaces (APIs), source code to implement the user's design, a data sheet of the user's design, and interrupt vectors. For example, referring to FIG. 1A, the user clicks on the generate application code button 301. The system may use all device configurations to update existing assembly-source and C compiler code and generate Application Program Interfaces (APIs) and Interrupt Service Routine (ISR) shells. At this time, the system also creates a data sheet based on the part configurations. Embodiments produce files that are suitable for use with emulators and debuggers to allow these configurations to be emulated and debugged in a simple and convenient fashion. This concludes the discussion of the steps of FIG. 2.

Source Code Files

Embodiments automatically generate source code files for realizing the user modules within the programmable system blocks 410 in the chip. Throughout this application the term source code may be defined as the code that is used to program registers on the chip to implement the selected user modules 304 as they have been placed by the user and to configure the programmable system blocks to operate with the user selected parameters, interconnections, and pin-outs. Thus, automatically generated source code programs may realize the user modules 304 within the programmable system blocks 410.

The automatically generated files may be programmed into flash memory of a target device (e.g., a microcontroller). The flash memory may then be used to program registers on the target device in order to implement a particular user module 304 in hardware (e.g., actual programmable system blocks 410). Therefore, the source code may be generated based on the selection, placement, and configuration of the user modules 304. For example, the automatic code generation processes take into account the parameterization of the user modules 304 and the placement of the user modules 304, which the user may perform via a GUI of embodiments of the present invention.

By using the automatically generated source code, a user need not be aware of all of the low level registers and other low level technical information required to program a microcontroller to realize the user modules 304. The user need only to interact with the GUIs which are written in a higher level of abstraction.

Exemplary source code files are included in FIGS. 7A–7C and FIGS. 8A–8B. The exemplary file of FIGS. 7A–7C is a data table which is used to set register values on the target device based on the user's configuration. The exemplary file of FIGS. 8A–8B moves the data from the file of FIGS. 7A–7C into memory (e.g., flash) on the target device.

Automatic generation of source code files is described in co-pending U.S. patent application Ser. No. 09/998,848, filed Nov. 15, 2001, entitled "DESIGN SYSTEM PROVIDING AUTOMATIC SOURCE CODE GENERATION FOR PERSONALIZATION AND PARAMETERIZATION OF USER MODULES," by Ogami, and assigned to the assignee of the present invention and incorporated herein by reference.

APIs

After the microcontroller has been configured to implement the selected user modules 304, the user may wish to program desired functionality into the microcontroller. For example, a user may wish the user modules 304, now implemented in programmable system blocks in hardware, to function in a certain fashion when the microcontroller is being used. Embodiments automatically generate APIs, which can be used to perform common functions that are required to interact with the user module (e.g., how to start the timer, how to stop the timer, how to talk to the timer, etc.) from an application program level. For example, a user may insert an API into a software program which he writes. Thus, one type of API may be described as a function call; however, APIs are not limited to function calls.

By using automatically generated APIs, a user need not be aware of all of the low level registers and other low level technical information required to instruct the user module to invoke its functions. The user need only to interact with the APIs which are written in a higher level of abstraction.

In one embodiment, the API files that are automatically generated include the name of the instantiation of the user module 304 for which they are associated. This makes it easy for the user to keep track of the files. The application editor workspace 365 allows easy viewing, presentation, and editing of these files. A directory window 366 (source tree window) provides a hierarchical ordering of these and other files by file type and user module.

Automatic generation of API files may take into consideration the configuration the user made. For example, the values to which certain registers are set may depend on which block 410 the user module 304 is placed in. FIG. 9A and FIG. 9B illustrate an exemplary API file that is automatically generated for a user module ADCINC12_1. This file contains the actual code for the API. FIG. 10 and FIG. 11 illustrate two more exemplary API files that may be generated for a user module named ADCINC12_1. Each instantiation of each user module 304 may have such files automatically generated for it. The file in FIG. 10 may be used to allow programs written in the C programming language to access the user module APIs. The file of FIG. 11 contains equates that are used by the APIs. The APIs simplify the designer's task by declaring values for various registers based on the programmable system blocks 410 the user module 304 occupies.

Additionally, the API files may be conditionally compiled based on the parameter selections the user made during device configuration. For example, a user module 304 for a digital-to-analog converter may have a parameter for the data format that allows three choices such as: "offset_binary", "twos_complement", and "two_byte_sign_and_magnitude". An API file may be generated by conditionally compiling the code based on the parameter selected.

Automatic generation of APIs is described in co-pending U.S. patent application Ser. No. 09/994,599, filed concurrently herewith, entitled "AUTOMATIC API GENERATION TO FUNCTIONAL PROGRAMMABLE SYSTEM BLOCKS," by Ogami et al., and assigned to the assignee of the present invention and incorporated herein by reference.

Interrupt Service Routines

ISRs (Interrupt Service Routines) may also be automatically generated during the device configuration. These may be shells or routines to provide the device-interface and interrupt-activity framework for source programming. Thus, interrupt service routines may be described as a type of API. Automatic generation of ISRs may be performed each time device application code is generated and is transparent to the user.

FIG. 12A and FIG. 12B illustrate an exemplary interrupt handler file which is automatically generated for a user module 304 for an analog-to-digital converter whose name is ADCINC12_1. The exemplary ISR contains some code because it performs part of the user module function. Other ISRs may be shells with no code automatically generated. The user may add code to either the shell ISR or the partially filled ISRs.

Interrupt Vectors

Embodiments automatically generate interrupt vectors, based on the placement of the user modules 304 on the programmable system blocks 410 during device configuration. In one embodiment, there are two types of interrupt vectors: fixed function and configurable programmable system blocks 410. Examples of fixed function interrupts may be: Reset, Supply Monitor, and Sleep Timer. The present invention is well-suited to a variety of other fixed function interrupts.

In the present embodiment, the configurable programmable system block interrupts may include eight digital block interrupts and four analog column block interrupts. The present invention is well-suited to other numbers of configurable programmable system block interrupts. The definition of a configurable programmable system block interrupt (e.g., the ISR that is called) depends on the user module 304 that occupies that block 410. The present invention is not limited to automatically generating interrupt vectors for programmable system blocks.

Thus, embodiments may build an interrupt vector table. In one embodiment, a call or jump to the user module's interrupt handler is inserted in a startup source file. The startup file may be run when the target device is re-booted. In this fashion, the proper interrupt handler will be called when its interrupt occurs during target device operation. FIG. 13A illustrates an interrupt vector table 1300 with code which has been automatically added. In particular, the "ljmp" instructions 1305 have been added.

The exemplary table 1350 in FIG. 13B shows how the startup source file vector names 1351 map to the data sheet interrupt names 1352 and to fixed and programmable system block (configurable) interrupts 1353. For example, interrupt 05 maps to digital programmable system block 410a "DBA03". Furthermore, it is of type programmable system block. Referring to FIG. 13A, a ljmp to the counter_16 ISR has been automatically placed in the vector table 1300 at the location for programmable system block DBA03. Referring now to FIG. 1B, the ljmp was placed automatically to reflect the configuration having module 304 CNTR16_MSB at digital block 410a "DBA03". Other interrupt vectors have been automatically added to the interrupt vector table 1300, as well.

Data Sheets

Embodiments may automatically generate a datasheet. The user module 304 and device descriptions may be stored in XML format. Parameterization information regarding the project may be combined with the XML user module and XML device descriptions to generate an HTML output datasheet for the design. Any output format can be used. An Extensible Stylesheet Language (XSL) extension may be used to perform the combination according to a predetermined stylesheet that represents the datasheet. However, the present invention is not limited to XML, XSL, and HTML to implement automatically generated datasheets.

The datasheet in HTML can be viewed by a browser and may include expected information of a datasheet including pin-out information, schematics, connectivity, parameters, block information, signal information, etc.

By using XSL to generate the HTML output (datasheet) based on XML descriptions, embodiments are very adaptable to changes in any of the user module 304 descriptions. For instance, the automatic datasheet generation process can readily be adapted to new user modules 304 by the mere addition of their XML files into a user module library. No recompiling of the software tool is required.

Automatic generation of datasheets is described in co-pending U.S. patent application Ser. No. 09/994,600, filed concurrently herewith, entitled "SYSTEM AND METHOD FOR DYNAMICALLY GENERATING A CONFIGURATION DATASHEET," by Ogami et al., and assigned to the assignee of the present invention and incorporated herein by reference.

FIG. 14 illustrates circuitry of computer system 100, which may form a platform for embodiments of facilitating programming of a microcontroller. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also Includes an optional data storage device 104 (e.g., a magnetic or optical disk and disk drive) coupled with the bus 99 for storing information and instructions.

With reference still to FIG. 14, system 100 of the present invention also includes an optional alphanumeric input device 106 including alphanumeric and function keys is coupled to bus 99 for communicating information and command selections to central processor unit 101. System 100 also optionally includes a cursor control device 107 coupled to bus 99 for communicating user input information and command selections to central processor unit 101. System 100 of the present embodiment also includes an optional display device 105 coupled to bus 99 for displaying information. A signal input/output communication device 108 coupled to bus 99 provides communication with external devices.

The preferred embodiment of the present invention, a method for facilitating programming a microcontroller, is thus described. While the present invention has been described in particular embodiments, it should be appreciated that the present invention should not be construed as limited by such embodiments, but rather construed according to the below claims.

We claim:

1. A method of facilitating a circuit design to be implemented in a programmable device, said method comprising
   a) causing to be displayed information related to a module of a plurality of available modules, said module representing a function implementable in programmable resources available in the programmable device, said display performed in response to said module being selected;
   b) a computer program determining a valid position for said module in a graphical user interface, said graphical user interface having a plurality of resource icons representing said programmable resources, said valid position based on characteristics of said module and characteristics of said programmable resources, said determination made in response to a user request for said valid position for said module in said graphical user interface; and
   c) providing in said resource icons an indication of said valid position of said module, said indication generated by said computer program.

2. The method of claim 1, further comprising:
   d) said computer program generating at least two elements selected from the group consisting of: an application programming interface (API) for programming an operation of said module, source code for realizing said module in said resources, an interrupt vector table having a call to an interrupt service routine for said module, and a data sheet for a circuit comprising selected modules as positioned in said graphical user interface.

3. The method of claim 1, further comprising:
   said computer program determining a new valid position for said module in said graphical user interface, said determination in response to a user request for a new position for said module.

4. The method of claim 3, wherein d) comprises:
   d1) receiving a user request for said new valid position for said module;
   d2) said computer program determining said new valid position for said module in said graphical user interface, based on characteristics of said module and characteristics of said resources; and
   d3) highlighting at least one of said resource icons on said graphical user interface to indicate said new valid position.

5. The method of claim 1, further comprising:
   d) said computer program determining positions for a plurality of modules in said graphical user interface, in response to requests from a user for positions for said plurality of modules; and
   d) displaying a graphical user interface to facilitate configuring interconnections between said resource icons.

6. The method of claim 1, wherein b) comprises:
   b1) said computer program determining said valid position, based on a description of said module and a description of said resources; and wherein c) comprises:
   c1) highlighting at least one of said resource icons on said graphical user interface to indicate said valid position.

7. The method of claim 1, wherein a) comprises displaying a datasheet for said module.

8. The method of claim 7, further comprising:
   d) causing to be displayed a plurality of graphical icons identifying sections of said datasheet to be displayed; and e) displaying a section of said datasheet in response to one of said graphical icons being selected.

9. The method of claim 1, wherein a) comprises displaying a circuit schematic for said module.

10. The method of claim 1, wherein said valid position is represented by at least one of said resource icons.

11. A computer readable medium having stored thereon program instructions for implementing a method for assisting circuit designing, said method comprising:
    a) determining valid positions in a graphical user interface for user selected modules to be placed in said graphical user interface, said graphical user interface describing programmable resources operable to implement said selected modules said valid positions based on characteristics of said user selected modules and characteristics of said programmable resources; and
    b) generating at least two elements selected from the group consisting of: an application programming interface (API) for programming an operation of a first of said user selected modules, source code for realizing said user selected modules in said resources, an interrupt vector table having a call to an interrupt service routine for a first of said user selected modules, and a data sheet for a circuit comprising said user selected modules as positioned in said graphical user interface.

12. The computer readable medium of claim 11, wherein said method further comprises:
    c) causing to be displayed information related to said first of said user selected modules in response to said first of said user selected modules being selected to be used in said circuit.

13. The computer readable medium of claim 11, wherein said method further comprises:
    d) determining a new valid position for said first of said user selected modules in said graphical user interface, said determination in response to a user request for said new valid position for said first of said selected modules.

14. The computer readable medium of claim 13, wherein d) of said method comprises:
    d1) determining said new valid position for said first of said user selected modules in said graphical user interface, based on an Extensible Markup Language (XML) description of said first of said user selected modules and an XML description of said resources; and
    d2) highlighting at least one resource icon on said graphical user interface to indicate said new valid position, said resource icon representing one of said resources.

15. The computer readable medium of claim 11, wherein said method further comprises:
    c) displaying a graphical user interface to facilitate configuring interconnections between said resources operable to implement said user selected modules.

16. The computer readable medium of claim 11, wherein a) of said method comprises:
    a1) receiving a user request for a valid position for said first of said user selected modules;
    a2) determining said valid position, based on an Extensible Markup Language (XML) description of said first of said user selected modules and an XML description of said resources; and
    a3) highlighting at least one resource icon on said graphical user interface to indicate said valid position, said resource icon representing one of said resources operable to implement said user selected modules.

17. The computer readable medium of claim 11, wherein said resources comprises a plurality of classes and at least one of said modules maps to a plurality of said classes; and wherein a) comprises:
 a1) receiving a user request for a valid position for a portion of said at least one module, said portion implementable in a first class of said plurality of classes of resources;
 a2) determining said valid position for said portion, based on an Extensible Markup Language (XML) description of said and an XML description of said first class of said plurality of classes of resources; and
 a3) highlighting at least one resource icon on said graphical user interface to indicate said valid position for said portion of said at least one module, said resource icon representing a resource in said first class of said plurality of classes of resources.

18. A method of facilitating programming a microcontroller, said method comprising:
 a) displaying a graphical user interface (GUI) comprising resource icons representing a layout of resources of said microcontroller;
 b) displaying information related to a module of a plurality of modules, said module representing a function implementable in said resources, said displaying information performed in response to said module being selected by a user;
 c) a computer program determining a valid position for said module in said layout of resources in the GUI reflecting a valid position for said function in said resources of said microcontroller based on characteristics of said module and characteristics of said resources; and
 d) displaying said valid position for said module in said layout of the resources, wherein programming said microcontroller is facilitated.

19. The method of claim 18, wherein said method further comprises:
 e) generating at least two elements selected from the group consisting of: an application programming interface (API) for causing said first module to perform an operation, source code for realizing said modules that comprise said circuit in said resources, an interrupt vector table having a call to an interrupt service routine for said first module, and a data sheet for said circuit.

20. The method of claim 18, further comprising:
 e) said computer program determining a new valid position for said module in said layout in the GUI reflecting a new valid position for said function in said resources of said microcontroller, said determination in response to a user request for a new position for said module.

21. The method of claim 20, wherein e) comprises:
 e1) receiving a user request for said new valid position for said module;
 e2) said computer program determining said new valid position for said module in said layout in said GUI, based on characteristics of said module and characteristics of said resources; and
 e3) highlighting at least one of said resource icons on said GUI to indicate said new valid position.

22. The method of claim 18, further comprising:
 e) said computer program determining positions for a plurality of modules in said GUI, in response to requests from a user for positions for said plurality of modules; and
 f) displaying a GUI to facilitate configuring interconnections between said resource icons.

23. The method of claim 18, wherein said c) comprises computing said valid position for said module based on an Extensible Markup Language (XML) description of said module and an XML description of said resources.

24. The method of claim 18, further comprising:
 e) causing to be displayed a selectable display of available module parameters in response to a request for said available module parameters for said module, said selectable display based on characteristics of said module.

25. The method of claim 18, wherein said b) comprises displaying a Hypertext Markup Language (HTML) datasheet for said module.

26. The method of claim 25, further comprising:
 e) displaying a section of said datasheet in response to a graphical icon being selected, said datasheet having a plurality of graphical icons identifying sections of said datasheet to be displayed.

27. The method of claim 18, wherein said b) comprises displaying a circuit schematic for said module.

* * * * *